United States Patent
Yamashiro et al.

(10) Patent No.: US 9,201,439 B2
(45) Date of Patent: Dec. 1, 2015

(54) SEMICONDUCTOR DEVICE

(71) Applicant: RENESAS ELECTRONICS CORPORATION, Kawasaki-shi, Kanagawa (JP)

(72) Inventors: Masao Yamashiro, Kanagawa (JP); Tatsuya Bando, Kanagawa (JP); Kunitoshi Kamada, Kanagawa (JP); Hiroshi Sato, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 234 days.

(21) Appl. No.: 13/751,326

(22) Filed: Jan. 28, 2013

(65) Prior Publication Data

US 2013/0241515 A1    Sep. 19, 2013

(30) Foreign Application Priority Data

Mar. 13, 2012  (JP) .................................. 2012-056077

(51) Int. Cl.
*H02M 3/07* (2006.01)
*G05F 1/625* (2006.01)

(52) U.S. Cl.
CPC ...................................... *G05F 1/625* (2013.01)

(58) Field of Classification Search
CPC ........... G05F 1/445; G05F 1/455; G05F 1/56; G05F 1/44; G05F 1/38; G05F 3/18; G05F 3/22; G05F 3/24; G05F 3/30; G05F 3/265; H02M 5/257; H02M 5/2573; H02M 5/2576; H02M 1/15; H02M 1/02; H02M 1/081

USPC ......... 323/300, 311, 317, 322, 323, 325, 326; 327/536

See application file for complete search history.

(56) References Cited

U.S. PATENT DOCUMENTS

| 5,881,014 | A  | * | 3/1999  | Ooishi .......................... 365/226 |
| 5,999,475 | A  |   | 12/1999 | Futatsuya et al. |
| 6,473,321 | B2 | * | 10/2002 | Kishimoto et al. ............. 363/59 |
| 6,487,120 | B2 |   | 11/2002 | Tanzawa et al. |
| 7,253,676 | B2 |   | 8/2007  | Fukuda et al. |
| 7,385,380 | B2 |   | 6/2008  | Ishigaki et al. |
| 7,706,194 | B2 |   | 4/2010  | Mori |
| 7,868,604 | B2 | * | 1/2011  | Tran et al. ...................... 323/317 |

(Continued)

FOREIGN PATENT DOCUMENTS

| JP | 11-134892 A   | 5/1999  |
| JP | 2001-338493 A | 12/2001 |

(Continued)

OTHER PUBLICATIONS

Communication dated Jun. 2, 2015 from the Japanese Patent Office in counterpart application No. 2012-056077.

*Primary Examiner* — Gary L Laxton
*Assistant Examiner* — Kevin H Sprenger
(74) *Attorney, Agent, or Firm* — Sughrue Mion, PLLC

(57) ABSTRACT

A semiconductor device includes a voltage hold circuit that raises a second boosted voltage with rise of an output voltage of a booster circuit that generates a first boosted voltage and then maintains the second boosted voltage at a point when the output voltage reaches a hold voltage level after that, and a first switch that short-circuits a first output terminal through which the first boosted voltage is output and a second output terminal through which the second boosted voltage is output until the output voltage reaches the hold voltage level.

13 Claims, 25 Drawing Sheets

(56) References Cited

U.S. PATENT DOCUMENTS

| | | |
|---|---|---|
| 8,026,702 B2 | 9/2011 | Tanzawa |
| 2003/0112056 A1* | 6/2003 | Tanzawa et al. ............. 327/536 |
| 2008/0304349 A1* | 12/2008 | Suzuki et al. ................ 365/226 |
| 2010/0237931 A1* | 9/2010 | Ogiwara et al. ............. 327/536 |

FOREIGN PATENT DOCUMENTS

| | | |
|---|---|---|
| JP | 2005-190533 A | 7/2005 |
| JP | 2007-189775 A | 7/2007 |
| JP | 2008-269727 A | 11/2008 |
| JP | 2009-301087 A | 12/2009 |

* cited by examiner

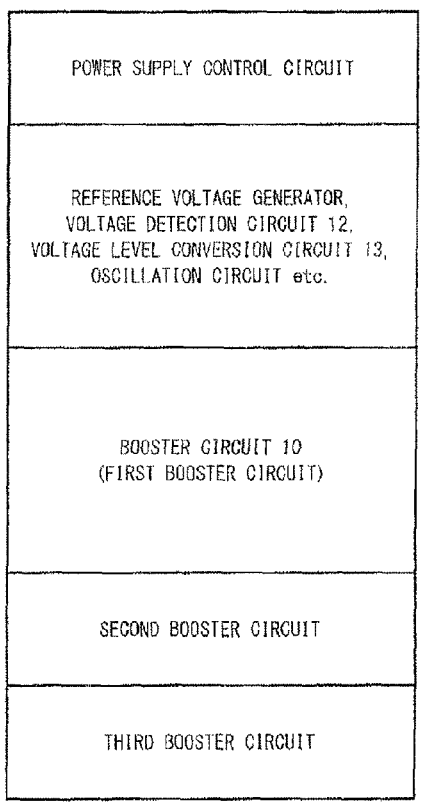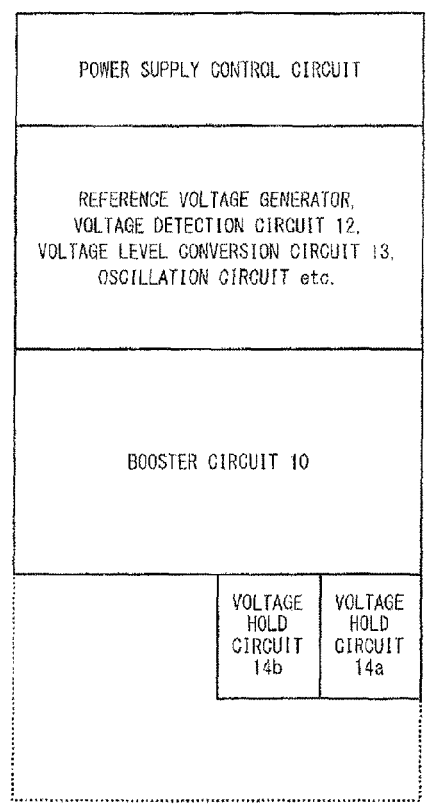
Fig 18
Fig 19

APPLIED VOLTAGE WHEN WRITING DATA TO MEMORY CELL CE11

| CELL | WRITE | APPLIED VOLTAGE [V] | | | |
|------|-------|------|------|------|------|
| | | WELL | G | SL | BL |
| CE11 | SELECTED | -11.5 | 1.5 | -11.5 | -11.5 |
| CE12 | NON-SELECTED | -11.5 | -10.5 | -11.5 | -11.5 |
| CE21 | NON-SELECTED | -11.5 | 1.5 | -4.5 | -4.5 |
| CE22 | NON-SELECTED | -11.5 | -10.5 | -4.5 | -4.5 |

-11.5V : Vcp2[Vwell, Vbl1, Vbl2]
-10.5V : V2[Vwl2]
-4.5V : V1[Vbl2, Vsl2]
1.5V : VDD[Vwl1]

Fig. 38

APPLIED VOLTAGE WHEN WRITING DATA TO MEMORY CELL CEA

| CELL | WRITE | APPLIED VOLTAGE [V] | | | | |
|---|---|---|---|---|---|---|
| | | MG | CG | SL | BL | |
| CEA | SELECTED | 10.0 | 1.0 | 5.0 | 0.8 | |
| CEB | NON-SELECTED | 10.0 | 1.0 | 5.0 | 1.5 | |
| CEC | NON-SELECTED | 3.5 | 0.0 | 5.0 | 0.8 | |
| CED | NON-SELECTED | 3.5 | 0.0 | 5.0 | 1.5 | |
| CEE | NON-SELECTED | 10.0 | 0.0 | 1.5 | 0.8 | |
| CEF | NON-SELECTED | 10.0 | 0.0 | 1.5 | 1.5 | |

10V : Vcp1[Vmg1]
5.0V : V2[Vs11]
3.5V : V1[Vs12]
1.5V : VDD[Vb11]
0.8V : DIVIDED VOLTAGE OF VDD[Vb12]
0.0V : VSS[Vw12, Vw13]

Fig. 40

SEMICONDUCTOR DEVICE

CROSS-REFERENCE TO RELATED APPLICATIONS

This application is based upon and claims the benefit of priority from Japanese patent application No. 2012-056077, filed on Mar. 13, 2012, the disclosure of which is incorporated herein in its entirety by reference.

BACKGROUND

The present invention relates to a semiconductor device and it is, for example, suitably applicable to a semiconductor device that generates a plurality of boosted voltages with a larger absolute value than an input voltage using a booster circuit.

In the semiconductor device, a power supply voltage is lowered, and a high voltage is partly used for a circuit or a memory element that requires a voltage higher than the power supply voltage. This allows the semiconductor device to reduce power consumption. In order to use a single external power supply and reduce the number of external terminals, a high voltage is generated from an input voltage by a booster circuit that is located internally without increasing the varieties of external power supply voltages that are supplied externally.

Techniques to generate a plurality of internal voltages are disclosed in Japanese Unexamined Patent Application Publications Nos. H11-134892 and 2009-301087. According to the technique disclosed in Japanese Unexamined Patent Application Publication No. H11-134892, a high voltage switch circuit is connected between output terminals of two charge pump circuits. Then, until the output voltage of the charge pump circuits reaches a specified voltage level, the high voltage switch circuit is turned into conduction so that the output voltage rises by the two charge pump circuits. On the other hand, after the output voltage reaches a specified voltage level, the high voltage switch circuit is turned off so that different output voltages are generated by the two charge pump circuits.

Further, according to the technique disclosed in Japanese Unexamined Patent Application Publication No. 2009-301087, a plurality of voltages obtained by adjusting a voltage value of a reference voltage by changing a code value are held by a sample and hold circuit, thereby generating a plurality of reference voltages.

SUMMARY

However, it is necessary for a booster circuit to use an element with a large circuit area such as a capacitor, and placing a plurality of booster circuits corresponding to the number of voltages to be generated results in larger circuit area. The other problems and novel features will become obvious from the description of the specification and the appended drawings.

According to one embodiment, a semiconductor device includes a voltage hold circuit that raises a second boosted voltage with rise of an output voltage of a booster circuit that generates a first boosted voltage and then maintains the second boosted voltage at a point when the output voltage reaches a hold voltage level after that, and a first switch that short-circuits a first output terminal through which the first boosted voltage is output and a second output terminal through which the second boosted voltage is output during a period until the output voltage reaches the hold voltage level.

According to one embodiment, a semiconductor device can generate a plurality of boosted voltages as well as reducing a circuit area.

BRIEF DESCRIPTION OF THE DRAWINGS

The above and other aspects, advantages and features will be more apparent from the following description of certain embodiments taken in conjunction with the accompanying drawings, in which:

FIG. 18 is a schematic diagram illustrating a layout area of a comparative example of the semiconductor device according to the third embodiment;

FIG. 19 is a schematic diagram illustrating a layout area of the semiconductor device according to the third embodiment;

FIG. 38 is a table to describe an applied voltage during writing to the memory cell array shown in FIG. 37;

FIG. 40 is a table to describe an applied voltage during writing to the memory cell array shown in FIG. 39.

DETAILED DESCRIPTION

First Embodiment

Embodiments of the present invention are described hereinafter with reference to the drawings. In the following embodiments, a voltage generation circuit that generates a plurality of boosted voltages from an output voltage that is output by one booster circuit as a semiconductor device is described.

Figure 1:
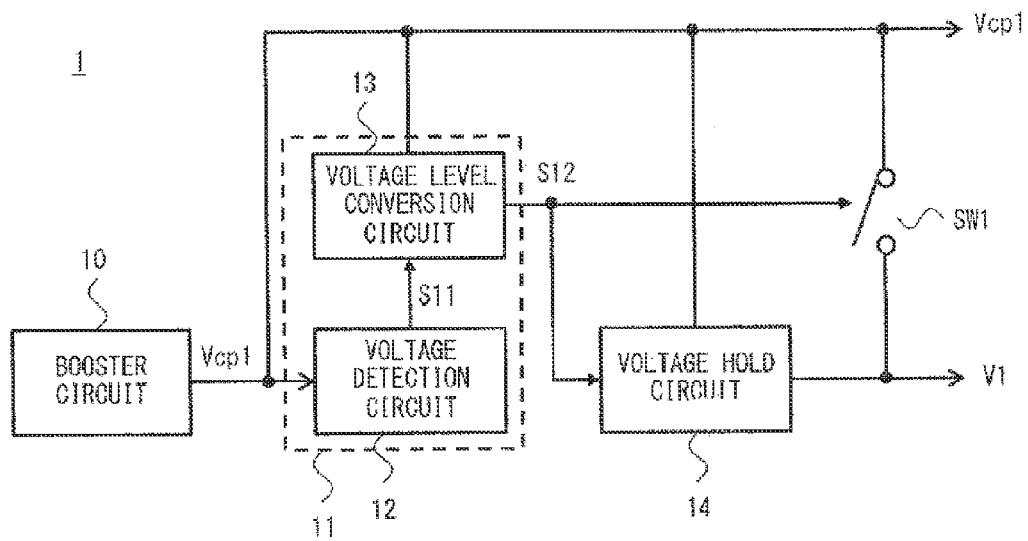
FIG. 1 is a block diagram of a semiconductor device according to a first embodiment.

FIG. 1 is a block diagram of a semiconductor device 1 according to a first embodiment. As shown in FIG. 1, the semiconductor device 1 includes a booster circuit 10, a control circuit 11, a voltage hold circuit 14, and a first switch SW1. Further, the semiconductor device 1 has a first output terminal to output a first boosted voltage Vcp1 and a second output terminal to output a second boosted voltage V1.

The booster circuit 10 boosts an input voltage (for example, a power supply voltage) and thereby generates the first boosted voltage Vcp1. The first boosted voltage Vcp1 is a final voltage of an output voltage that is output from the booster circuit 10. In other words, the booster circuit 10 gradually increases the voltage value of the output voltage and finally makes the output voltage the first boosted voltage Vcp1.

The control circuit 11 generates a switch signal S12 that switches the first switch SW1 from close to open when the output voltage of the booster circuit 10 reaches a hold voltage level that is set for the voltage hold circuit 14. In the example shown in FIG. 1, the control circuit 11 includes a voltage detection circuit 12 and a voltage level conversion circuit 13.

The voltage detection circuit 12 operates on the basis of a power supply voltage and a ground voltage and detects that the output voltage of the booster circuit 10 exceeds a set hold voltage level and then outputs a voltage detection signal S11. The voltage level conversion circuit 13 converts the maximum value of the amplitude of the voltage detection signal S11 into a voltage in accordance with the output voltage of the booster circuit 10.

The voltage hold circuit 14 holds the second boosted voltage V1 that is lower than the first boosted voltage Vcp1. To be more specific, the voltage hold circuit 14 increases the voltage value of the second boosted voltage V1 to be output in accordance with the output voltage of the booster circuit 10 during the period when the switch signal S12 indicates the close of the first switch SW1. Further, during the period when the switch signal S12 indicates the open of the first switch SW1, the voltage hold circuit 14 maintains the voltage value of the second boosted voltage V1 at the point when the value of the switch signal is changed.

The first switch SW1 is placed between the first output terminal to output the first boosted voltage Vcp1 and the second output terminal to output the second boosted voltage V1. The close and open of the first switch SW1 is controlled in accordance with the switch signal S12.

Figure 2:
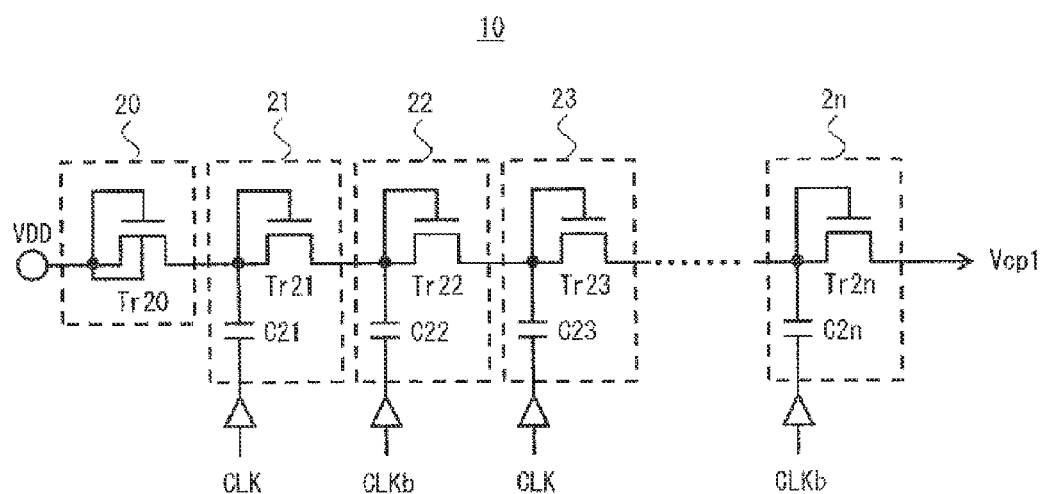
FIG. 2 is a circuit diagram of a booster circuit according to the first embodiment.

The details of each circuit block are further described hereinbelow. FIG. 2 shows a detailed circuit diagram of the booster circuit 10. As shown in FIG. 2, the booster circuit 10 includes a backflow prevention circuit 20 and boost stage circuits 21 to 2n (n is an integer indicating the number of stages of a circuit). The backflow prevention circuit 20 includes a transistor Tr20. The transistor Tr20 is diode-connected and functions as a diode. The diode formed by the transistor Tr20 has an anode connected to a power supply terminal VDD through which an input voltage (for example, a power supply voltage) is supplied and a cathode connected to the boost stage circuit 21.

The boost stage circuits 21 to 2n have the same circuit configuration. The circuit configuration of the boost stage circuits is described with reference to the boost stage circuit 21 as an example. The boost stage circuit 21 includes a transistor Tr21 and a boost capacitor C21. The transistor Tr21 is diode-connected and functions as a diode. The diode formed by the transistor Tr21 has an anode connected to the circuit in the previous stage and a cathode connected to the circuit in the subsequent stage. In the case of the boost stage circuit 21, the diode formed by the transistor Tr21 has an anode connected to the backflow prevention circuit 20 in the previous stage and a cathode connected to the boost stage circuit 22 in the subsequent stage. The cathode of the diode formed by the transistor Tr2n of the boost stage circuit 2n in the final stage serves as the output terminal of the booster circuit 10. Further, one end of the boost capacitor C21 is connected to the anode of the diode formed by the transistor Tr21. An operation clock CLK is supplied to the other end of the boost capacitor C21 through a buffer. Note that, in the booster circuit 10, operation clocks inverted from each other are supplied to the adjacent boost stage circuits. In the example shown in FIG. 1, the operation clock CLK is supplied to the boost stage circuits 21 and 23, and an inverted operation clock CLKb of the operation clock CLK is supplied to the boost stage circuits 22 and 2n. Note that the operation clock CLK and the inverted operation clock CLKb are generated by an oscillation circuit, which is not shown.

Figure 3:
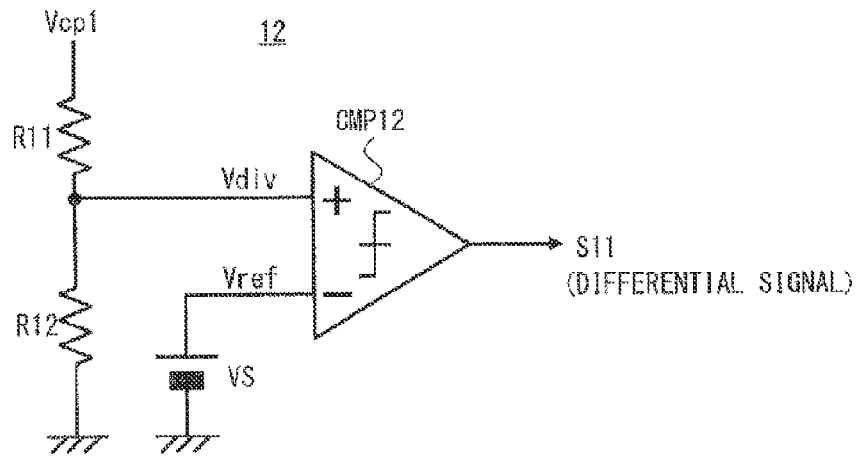
FIG. 3 is a circuit diagram of a voltage detection circuit according to the first embodiment.

FIG. 3 is a circuit diagram of the voltage detection circuit 12 according to the first embodiment. As shown in FIG. 3, the voltage detection circuit 12 includes a comparator CMP12, a reference voltage generator VS, a resistor R11 and a resistor R12. The resistors R11 and R12 are connected in series between a boost node to which the output voltage of the booster circuit 10 is supplied and a bias terminal to which a specified voltage is supplied. In the example of FIG. 3, Vcp1 is used as a reference symbol indicating the boost node. Further, in the voltage detection circuit 12 shown in FIG. 3, the ground terminal VSS to which a ground voltage is supplied corresponds to the bias terminal.

The reference voltage generator VS generates a reference voltage Vref. The reference voltage generator VS is a band gap voltage source, for example, and outputs a band gap voltage as the reference voltage Vref.

The comparator CMP12 compares a divided voltage Vdiv that is generated at a connection node connecting the resistor R11 and the resistor R12 with the reference voltage Vref and switches the logic level of the voltage detection signal S11. Note that the voltage detection signal S11 is a differential signal. For example, the comparator CMP12 enables the voltage detection signal S11 when the divided voltage Vdiv exceeds the reference voltage Vref. In other words, the voltage detection circuit 12 sets the divided voltage Vdiv at the point when the output voltage of the booster circuit 10 reaches the hold voltage level to the reference voltage Vref and thereby detects that the output voltage reaches the hold voltage level. Note that the divided voltage Vdiv can be adjusted by adjusting the ratio of the resistances of the resistor R11 and the resistor R12.

Figure 4:
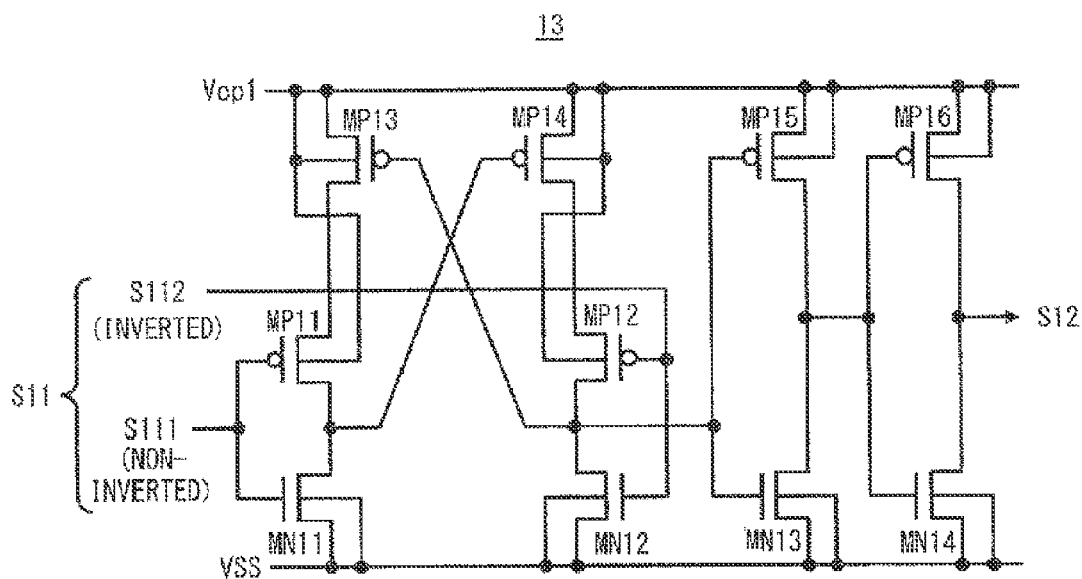
FIG. 4 is a circuit diagram of a voltage level conversion circuit according to the first embodiment.

FIG. 4 is a circuit diagram of the voltage level conversion circuit 13 according to the first embodiment. As shown in FIG. 4, the voltage level conversion circuit 13 includes NMOS transistors MN11 to MN14 and PMOS transistors MP11 to MP16.

The source of the NMOS transistor MN11 is connected to the ground terminal VSS. The drain of the NMOS transistor MN11 is connected to the drain of the PMOS transistors MP11. The gate of the NMOS transistor MN11 and the gate of the PMOS transistors MP11 are connected in common and a non-inverted signal S111 of the voltage detection signal S11 is input thereto. The source of the NMOS transistor MN12 is connected to the ground terminal VSS. The drain of the NMOS transistor MN12 is connected to the drain of the PMOS transistors MP12. The gate of the NMOS transistor MN12 and the gate of the PMOS transistors MP12 are connected in common and an inverted signal S112 of the voltage detection signal S11 is input thereto.

The source of the PMOS transistors MP11 is connected to the boost node through the PMOS transistor MP13. The source of the PMOS transistors MP12 is connected to the boost node through the PMOS transistor MP14. In FIG. 4, Vcp1 is shown as a symbol indicating the boost node. The gate of the PMOS transistor MP13 is connected to a node connecting the drain of the NMOS transistor MN12 and the drain of the PMOS transistors MP12. The gate of the PMOS transistor MP14 is connected to a node connecting the drain of the NMOS transistor MN11 and the drain of the PMOS transistors MP11.

The NMOS transistor MN13 and the PMOS transistor MP15 are connected in series between the boost node and the ground terminal VSS and functions as an inverter. The inverter formed by the NMOS transistor MN13 and the PMOS transistor MP15 outputs a signal which is an inverted logic of the signal generated at a node connecting the drain of the NMOS transistor MN12 and the drain of the PMOS transistors MP12.

The NMOS transistor MN14 and the PMOS transistor MP16 are connected in series between the boost node and the ground terminal VSS and functions as an inverter. The inverter formed by the NMOS transistor MN14 and the PMOS transistor MP16 outputs a signal which is an inverted logic of the signal output by the inverter formed by the NMOS transistor MN13 and the PMOS transistor MP15. The output signal of the inverter formed by the NMOS transistor MN14 and the PMOS transistor MP16 serves as the switch signal S12.

An operation of the voltage level conversion circuit 13 is described hereinafter. First, in the semiconductor device 1, when the voltage detection signal S11 is enabled, the non-inverted signal S111 becomes HIGH level (for example, the power supply voltage) and the inverted signal S112 becomes LOW level (for example, the ground voltage). Then, in the voltage level conversion circuit 13, when the voltage detection signal S11 is enabled, the NMOS transistor MN11 turns ON, and the PMOS transistor MP11 turns OFF. The connection node connecting the drain of the NMOS transistor MN11 and the drain of the PMOS transistor MP11 becomes LOW level (for example, the ground voltage), and the PMOS transistor MP14 turns ON. Further, in the voltage level conversion circuit 13, when the voltage detection signal S11 is enabled, the NMOS transistor MN12 turns OFF, and the PMOS transistor MP12 turns ON. The connection node connecting the drain of the NMOS transistor MN12 and the drain of the PMOS transistor MP12 thereby becomes HIGH level (for example, the output voltage of the booster circuit 10 which is supplied to the boost node), and the PMOS transistor MP13 turns OFF.

Further, as a result that the connection node connecting the drain of the NMOS transistor MN12 and the drain of the PMOS transistor MP12 becomes HIGH level, the inverter formed by the NMOS transistor MN13 and the PMOS transistor MP15 outputs LOW level ((for example, the ground voltage). Then, the inverter formed by the NMOS transistor MN14 and the PMOS transistor MP16 outputs HIGH level (for example, the output voltage of the booster circuit 10 which is supplied to the boost node).

Thus, when the voltage detection signal S11 is enabled, the voltage level conversion circuit 13 sets the switch signal S12 to HIGH level. On the other hand, when the voltage detection signal S11 is disabled, the voltage detection circuit 12 sets the non-inverted signal S111 to LOW level (for example, the ground voltage) and sets the inverted signal S112 to HIGH level (for example, the power supply voltage). At this time, the voltage level conversion circuit 13 sets the switch signal S12 to LOW level (for example, the ground voltage) by a complementary operation to the operation for the voltage detection signal S11 in enabled state.

Note that, the control circuit 11 sets the switch signal S12 to HIGH level when making the first switch SW1 open and sets the switch signal S12 to LOW level when making the first switch SW1 close.

Figure 5:
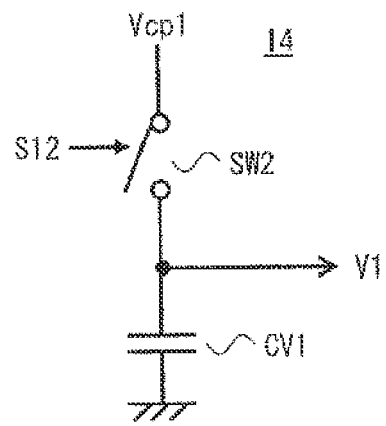
FIG. 5 is a circuit diagram of a voltage hold circuit according to the first embodiment.

FIG. 5 shows a circuit diagram of the voltage hold circuit 14 according to the first embodiment. As shown in FIG. 5, the voltage hold circuit 14 includes a second switch SW2 and a voltage hold capacitor CV1. The second switch SW2 is controlled to open during the period when the output voltage of the booster circuit 10 has a larger absolute value than the hold voltage level in accordance with the switch signal S12. On the other hand, the second switch SW2 is controlled to close during the period when the output voltage of the booster circuit 10 has a smaller absolute value than the hold voltage level in accordance with the switch signal S12. One end of the voltage hold capacitor CV1 is connected to the boost node at which the output voltage of the booster circuit 10 is generated through the second switch SW2, and the other end of the voltage hold capacitor CV1 is connected to the bias terminal to which a specified voltage is supplied. In the example of FIG. 5, Vcp1 is used as a reference symbol indicating the boost node. Further, in the voltage hold circuit 14 shown in FIG. 5, the ground terminal VSS to which the ground voltage is supplied corresponds to the bias terminal. Then, the voltage hold circuit 14 outputs a voltage at the voltage hold node connecting the voltage hold capacitor CV1 and the second switch SW2 as the second boosted voltage V1.

Figure 6:
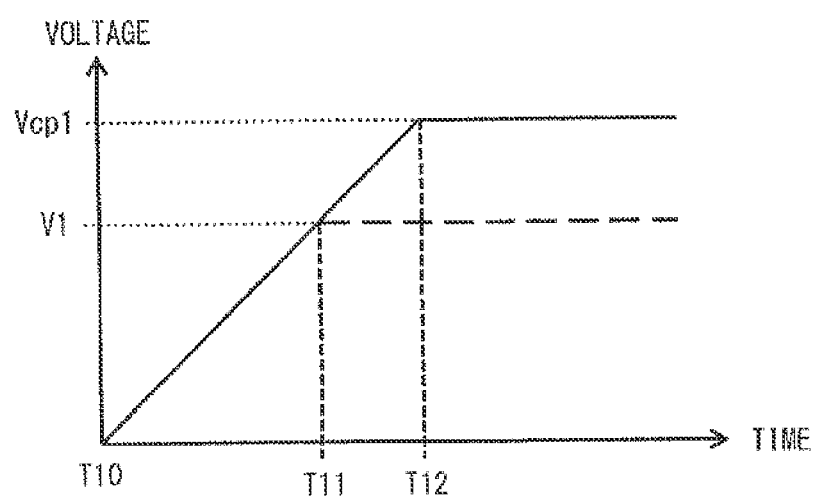
FIG. 6 is a timing chart showing an operation of the semiconductor device according to the first embodiment.

The operation of the semiconductor device 1 according to the first embodiment is described hereinbelow. FIG. 6 is a timing chart showing an operation of the semiconductor device 1 according to the first embodiment. In the example shown in FIG. 6, at timing T10, the booster circuit 10 starts the boost operation. Then, the booster circuit 10 raises the output voltage and, at timing T11, the output voltage reaches the voltage level held by the voltage hold circuit 14. Thus, at timing T11, the voltage detection circuit 12 switches the voltage detection signal S11 from disabled state to enabled state. In response that the voltage detection signal S11 becomes enabled, the voltage level conversion circuit 13 switches the switch signal S12 from LOW level to HIGH level. Then, at timing T11, the first switch SW1 switches to open in accordance with the switch signal S12. Further, at timing T11, the voltage hold circuit 14 makes the second switch SW2 open and outputs the output voltage at the point of reaching the hold voltage level as the second boosted voltage V1 based on the charges accumulated in the voltage hold capacitor CV1 during the period up to that time.

After that, the booster circuit 10 continues the boost operation of the output voltage and, at timing T12, the output voltage reaches the first boosted voltage Vcp1. After timing T12, the semiconductor device 1 outputs the first boosted voltage Vcp1 and the second boosted voltage V1.

Figure 7:
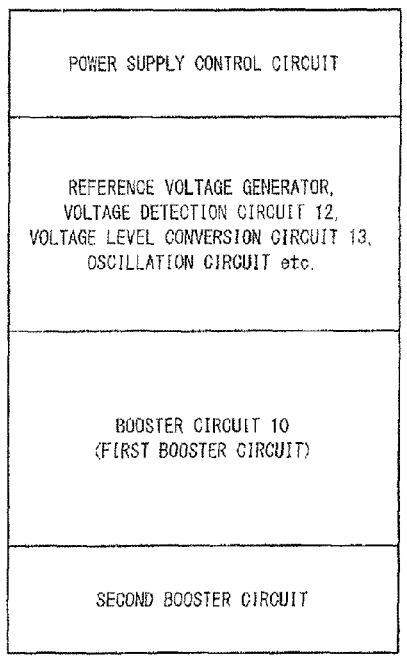
FIG. 7 is a schematic diagram illustrating a layout area of a comparative example of the semiconductor device according to the first embodiment.

The layout area of the semiconductor device 1 according to the first embodiment is described hereinbelow. First, FIG. 7 shows a schematic diagram illustrating the layout area of a comparative example of the semiconductor device 1 according to the first embodiment. The semiconductor device of the comparative example includes a second booster circuit in place of the voltage hold circuit 14 of the semiconductor device 1 according to the first embodiment, which corresponds to the semiconductor device disclosed in Japanese Unexamined Patent Application Publication No. H11-134892. As shown in FIG. 7, in the semiconductor device according to this comparative example, the second booster circuit with a smaller layout area than the booster circuit 10 (for example, the first booster circuit) is placed.

Figure 8:
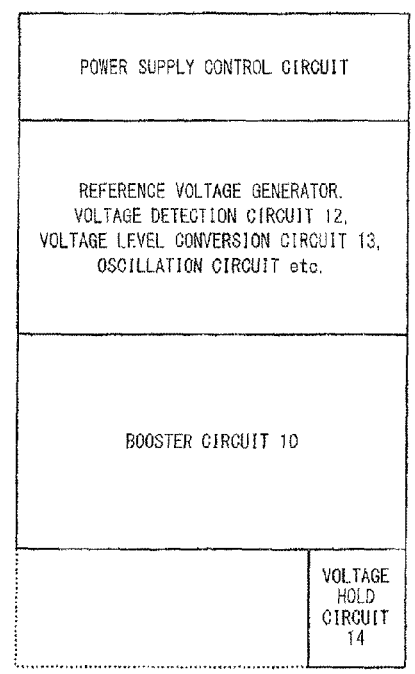
FIG. 8 is a schematic diagram illustrating a layout area of the semiconductor device according to the first embodiment.

On the other hand, FIG. 8 shows a schematic diagram illustrating the layout area of the semiconductor device 1 according to the first embodiment. As shown in FIG. 8, the semiconductor device 1 according to the first embodiment includes the voltage hold circuit 14. In FIG. 8, the layout area of the second booster circuit of FIG. 7 is shown as an area enclosed by a dotted line for comparison. The voltage hold circuit 14 can be placed in a smaller layout area than the second booster circuit. Although the second booster circuit has a lower current output capacity and a smaller capacitor's capacitance than the first booster circuit, it still requires a large number of capacitors, which results in large circuit area. On the other hand, the voltage hold circuit 14 according to the first embodiment can be composed of one capacitor and one switch, and therefore the circuit area can be significantly smaller than that of the second booster circuit.

As described above, in the semiconductor device 1 according to the first embodiment, the voltage generated during boosting of the output voltage by the booster circuit 10 is held as the second boosted voltage V1 in the voltage hold circuit 14. Therefore, the first boosted voltage Vcp1 and the second boosted voltage V1 with a different voltage value from the first boosted voltage Vcp1 can be generated in a single booster circuit. Further, the voltage hold circuit 14 that outputs the second boosted voltage V1 can be configured using a smaller number of elements than the booster circuit. Thus, in the semiconductor device 1 according to the first embodiment, it is possible to prevent an increase in circuit area in spite of the varieties of voltage values of the boosted voltage to be generated.

Further, in the semiconductor device 1 according to the first embodiment, the first switch SW1 is controlled to close until the output voltage of the booster circuit 10 reaches the hold voltage level. When the output voltage that is halfway through boosting reaches the hold voltage level, the voltage hold circuit 14 holds the output voltage at that point as the second boosted voltage V1. Thus, the voltage hold circuit 14 has a small capacity for driving a load circuit to which the second boosted voltage V1 is supplied. Accordingly, if there is no first switch SW1, the rising speed of the second boosted voltage V1 is low due to the load current consumed in the circuit driven by the second boosted voltage V1. However, in the semiconductor device 1 according to the first embodiment, the voltage of the second boosted voltage V1 is boosted until the output voltage of the booster circuit 10 reaches the hold voltage level in the state where the first switch SW1 is controlled to close. Consequently, even if the driving capability of the voltage hold circuit 14 is set to be low, the rising speed of the second boosted voltage V1 can be high in the semiconductor device 1 according to the first embodiment.

Furthermore, in the semiconductor device 1 according to the first embodiment, the control circuit 11 includes the voltage detection circuit 12 and the voltage level conversion circuit 13. In this manner, by converting the maximum value of the amplitude of the voltage detection signal S11 into a voltage in accordance with the output voltage using the voltage level conversion circuit 13, it is possible to enlarge the amplitude of the switch signal S12 for controlling the first switch SW1, with the voltage detection circuit 12 configured using a circuit element having a low withstand voltage. The layout area of a transistor tends to be larger as the withstand voltage of the transistor is higher. Therefore, by configuring the voltage detection circuit 12 using a circuit element with a low withstand voltage, the circuit area of the voltage detection circuit 12 can be reduced, which allows further reduction of the circuit area of the semiconductor device 1.

Second Embodiment

In a second embodiment, an example in which the technique related to the semiconductor device 1 according to the first embodiment is applied to a negative booster circuit that generates a negative boosted voltage that is lower than the ground voltage is described.

Figure 9:
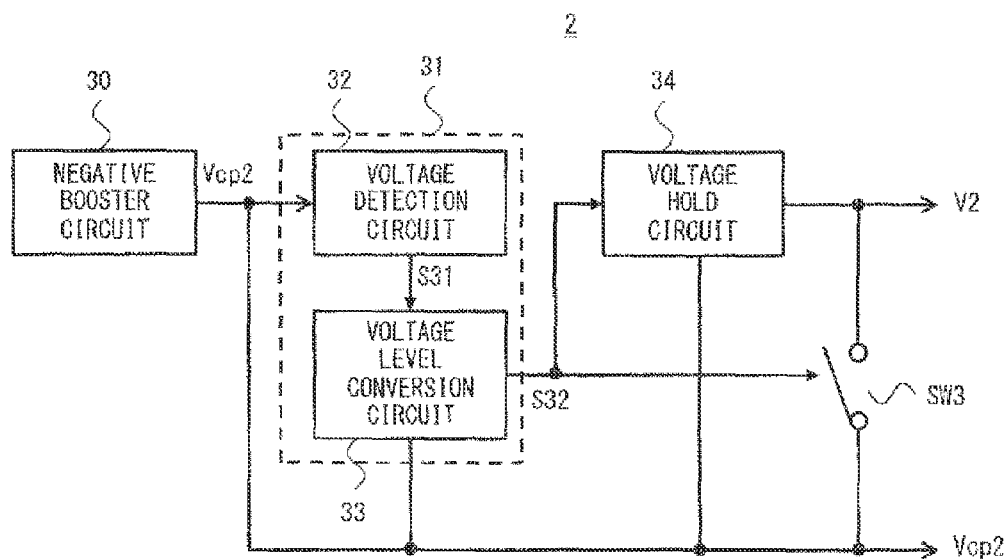
FIG. 9 is a block diagram of a semiconductor device according to a second embodiment.

FIG. 9 shows a block diagram of a semiconductor device 2 according to a second embodiment. As shown in FIG. 9, the semiconductor device 2 includes a negative booster circuit 30, a control circuit 31, a voltage hold circuit 34, and a first switch SW3. Further, the semiconductor device 2 has a first output terminal to output a first boosted voltage Vcp2 and a second output terminal to output a second boosted voltage V2.

The negative booster circuit 30 boosts an input voltage (for example, a ground voltage) to negative and thereby generates the first boosted voltage Vcp2. The first boosted voltage Vcp2 is a final voltage of an output voltage that is output from the negative booster circuit 30. In other words, the negative booster circuit 30 gradually decreases the voltage value of the output voltage and finally makes the output voltage the first boosted voltage Vcp2.

The control circuit 31 generates a switch signal S12 that switches the first switch SW3 from close to open when the output voltage of the negative booster circuit 30 reaches a hold voltage level that is set for the voltage hold circuit 34. In the example shown in FIG. 9, the control circuit 31 includes a voltage detection circuit 32 and a voltage level conversion circuit 33.

The voltage detection circuit 32 operates on the basis of a power supply voltage and a ground voltage and detects that the output voltage of the negative booster circuit 30 exceeds a set hold voltage level and then outputs a voltage detection signal S31. The voltage level conversion circuit 33 converts the maximum value of the amplitude of the voltage detection signal S31 into a voltage in accordance with the output voltage of the negative booster circuit 30.

The voltage hold circuit 34 holds the second boosted voltage V2 that is higher than the first boosted voltage Vcp2. To be more specific, the voltage hold circuit 34 decreases the voltage value of the second boosted voltage V2 to be output in accordance with the output voltage of the negative booster circuit 30 during the period when the switch signal S32 indicates the close of the first switch SW3. Further, during the period when the switch signal S32 indicates the open of the first switch SW3, the voltage hold circuit 34 maintains the voltage value of the second boosted voltage V2 at the point when the value of the switch signal is changed.

The first switch SW3 is placed between the first output terminal to output the first boosted voltage Vcp2 and the second output terminal to output the second boosted voltage V2. The close and open of the first switch SW3 is controlled in accordance with the switch signal S32.

Figure 10:
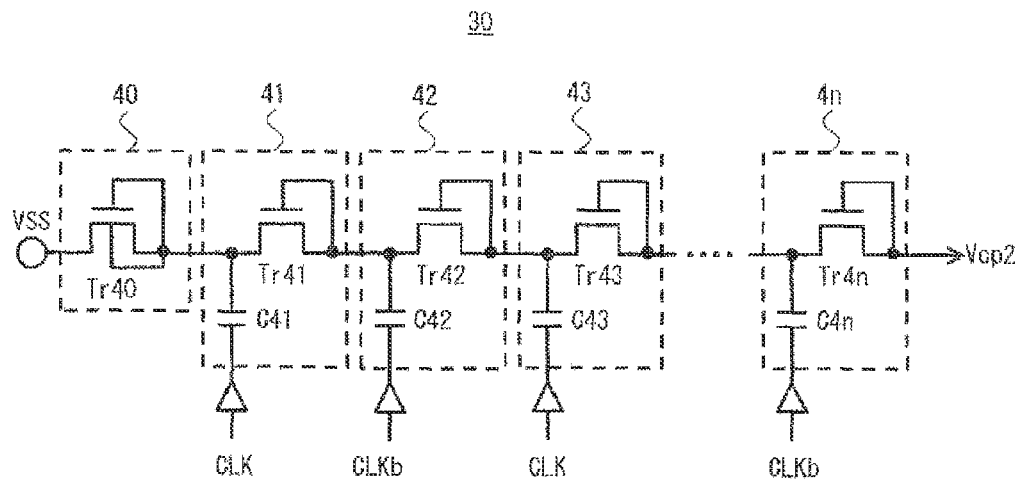
FIG. 10 is a circuit diagram of a negative booster circuit according to the second embodiment.

The details of each circuit block are further described hereinbelow. FIG. 10 shows a detailed circuit diagram of the negative booster circuit 30. As shown in FIG. 10, the negative booster circuit 30 includes a backflow prevention circuit 40 and boost stage circuits 41 to 4n (n is an integer indicating the number of stages of a circuit). The backflow prevention circuit 40 includes a transistor Tr40. The transistor Tr40 is diode-connected and functions as a diode. The diode formed by the transistor Tr40 has a cathode connected to a ground terminal VSS through which an input voltage (for example, a ground voltage) is supplied and an anode connected to the boost stage circuit 41.

The boost stage circuits 41 to 4n have the same circuit configuration. The circuit configuration of the boost stage circuits is described with reference to the boost stage circuit 41 as an example. The boost stage circuit 41 includes a transistor Tr41 and a boost capacitor C41. The transistor Tr41 is diode-connected and functions as a diode. The diode formed by the transistor Tr41 has a cathode connected to the circuit in the previous stage and an anode connected to the circuit in the subsequent stage. In the case of the boost stage circuit 41, the diode formed by the transistor Tr41 has a cathode connected to the backflow prevention circuit 40 in the previous stage and an anode connected to the boost stage circuit 42 in the subsequent stage. The anode of the diode formed by the transistor Tr4n of the boost stage circuit 4n in the final stage serves as the output terminal of the negative booster circuit 30. Further, one end of the boost capacitor C41 is connected to the cathode of the diode formed by the transistor Tr41. An operation clock CLK is supplied to the other end of the boost capacitor C41 through a buffer. Note that, in the negative booster circuit 30, operation clocks inverted from each other are supplied to the adjacent boost stage circuits. In the example shown in FIG. 10, the operation clock CLK is supplied to the boost stage circuits 41 and 43, and an inverted operation clock CLKb of the operation clock CLK is supplied to the boost stage circuits 42 and 4n. Note that the operation clock CLK and the inverted operation clock CLKb are generated by an oscillation circuit, which is not shown.

Figure 11:
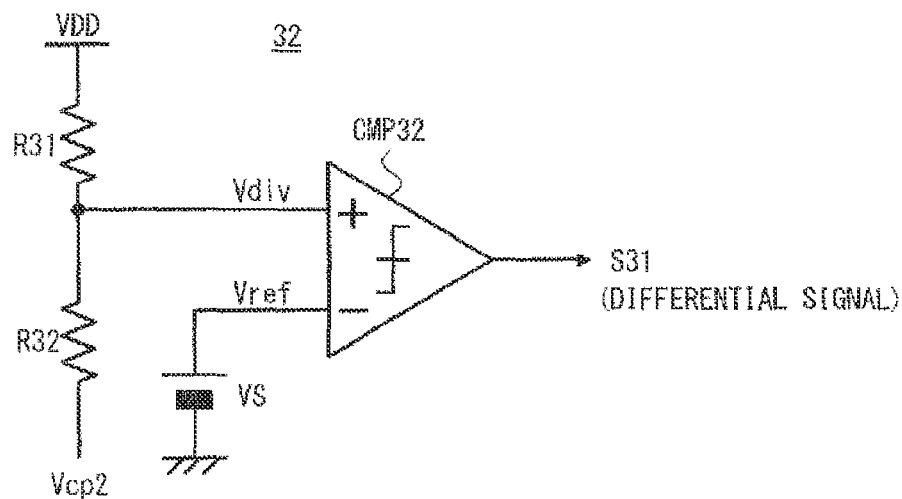
FIG. 11 is a circuit diagram of a voltage detection circuit according to the second embodiment.

FIG. 11 is a circuit diagram of the voltage detection circuit 32 according to the second embodiment. As shown in FIG. 11, the voltage detection circuit 32 includes a comparator CMP32, a reference voltage generator VS, a resistor R31 and a resistor R32. The resistors R31 and R32 are connected in series between a boost node to which the output voltage of the negative booster circuit 30 is supplied and a bias terminal to which a specified voltage is supplied. In the example of FIG. 11, Vcp2 is used as a reference symbol indicating the boost node. Further, in the voltage detection circuit 32 shown in FIG. 11, the power supply terminal VDD to which a power supply voltage is supplied corresponds to the bias terminal.

The reference voltage generator VS generates a reference voltage Vref. The reference voltage generator VS is a band gap voltage source, for example, and outputs a band gap voltage as the reference voltage Vref.

The comparator CMP32 compares a divided voltage Vdiv that is generated at a connection node connecting the resistor R31 and the resistor R32 with the reference voltage Vref and switches the logic level of the voltage detection signal S31. Note that the voltage detection signal S31 is a differential signal. For example, the comparator CMP32 enables the voltage detection signal S31 when the divided voltage Vdiv exceeds (for example, falls below) the reference voltage Vref. In other words, the voltage detection circuit 32 sets the divided voltage Vdiv at the point when the output voltage of the negative booster circuit 30 reaches the hold voltage level to the reference voltage Vref and thereby detects that the output voltage reaches the hold voltage level. Note that the divided voltage Vdiv can be adjusted by adjusting the ratio of the resistances of the resistor R31 and the resistor R32.

Figure 12:
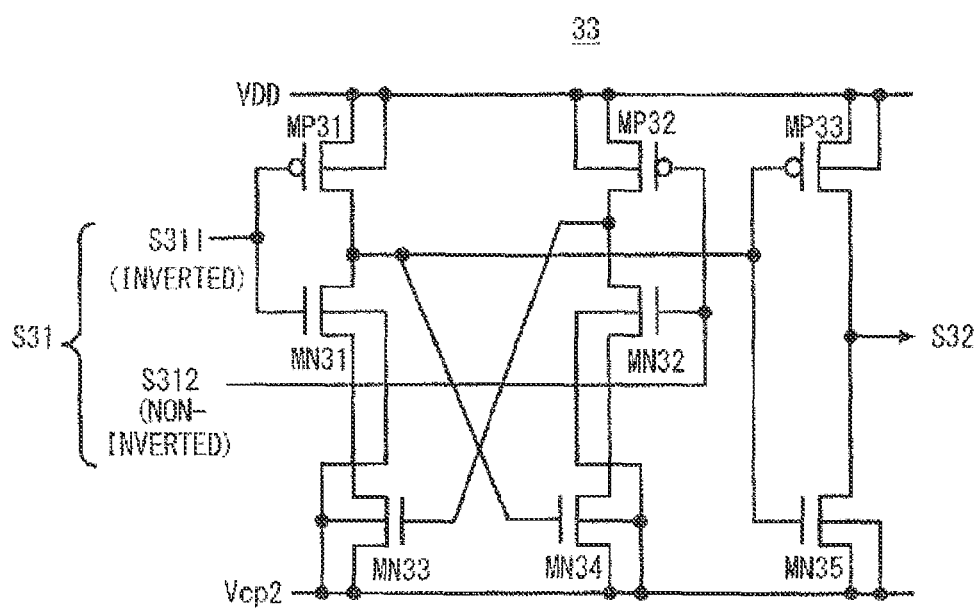
FIG. 12 is a circuit diagram of a voltage level conversion circuit according to the second embodiment.

FIG. 12 is a circuit diagram of the voltage level conversion circuit 33 according to the second embodiment. As shown in FIG. 12, the voltage level conversion circuit 33 includes NMOS transistors MN31 to MN35 and PMOS transistors MP31 to MP33.

The source of the PMOS transistors MP31 is connected to the power supply terminal VDD. The drain of the PMOS transistors MP31 is connected to the drain of the NMOS transistor MN31. The gate of the PMOS transistors MP31 and the gate of the NMOS transistor MN31 are connected in common and a non-inverted signal S311 of the voltage detection signal S31 is input thereto. The source of the PMOS transistors MP32 is connected to the power supply terminal VDD. The drain of the PMOS transistor MP32 is connected to the drain of the NMOS transistors MN32. The gate of the PMOS transistor MP31 and the gate of the NMOS transistors MN31 are connected in common and an inverted signal S312 of the voltage detection signal S31 is input thereto.

The source of the NMOS transistor MN31 is connected to the boost node through the NMOS transistor MN33. The source of the NMOS transistor MN32 is connected to the boost node through the NMOS transistor MN34. In FIG. 12, Vcp2 is shown as a symbol indicating the boost node. The gate of the NMOS transistor MN33 is connected to a node connecting the drain of the PMOS transistor MP32 and the drain of the NMOS transistor MN32. The gate of the NMOS transistor MN34 is connected to a node connecting the drain of the PMOS transistor MP31 and the drain of the NMOS transistor MN31.

The PMOS transistor MP33 and the NMOS transistor MN35 are connected in series between the power supply terminal VDD and the boost node and functions as an inverter. The inverter formed by the PMOS transistor MP33 and the NMOS transistor MN35 outputs a signal which is an inverted logic of the signal generated at a node connecting the drain of the PMOS transistor MP31 and the drain of the NMOS transistor MN31. The output signal of the inverter formed by the PMOS transistor MP33 and the NMOS transistor MN35 serves as the switch signal S32.

An operation of the voltage level conversion circuit 33 is described hereinafter. First, in the semiconductor device 2, when the voltage detection signal S31 is enabled, the non-inverted signal S111 is LOW level (for example, the ground voltage) and the inverted signal S112 is HIGH level (for example, the power supply voltage). Then, in the voltage level conversion circuit 33, when the voltage detection signal S31 is enabled, the PMOS transistor MP31 turns ON, and the NMOS transistor MN31 turns OFF. The connection node connecting the drain of the PMOS transistor MP31 and the drain of the NMOS transistor MN31 thereby becomes HIGH level (for example, the power supply voltage), and the NMOS transistor MN34 turns ON. Further, in the voltage level conversion circuit 33, when the voltage detection signal S31 is enabled, the PMOS transistor MP32 turns OFF, and the NMOS transistor MN32 turns ON. The connection node connecting the drain of the PMOS transistor MP32 and the drain of the NMOS transistor MN32 thereby becomes LOW level (for example, the output voltage of the negative booster circuit 30 which is supplied to the boost node), and the NMOS transistor MN33 turns OFF.

Further, as a result that the connection node connecting the drain of the PMOS transistor MP31 and the drain of the NMOS transistor MN31 becomes HIGH level, the inverter formed by the PMOS transistor MP33 and the NMOS transistor MN35 outputs LOW level ((for example, the output voltage of the negative booster circuit 30 which is supplied to the boost node).

Thus, when the voltage detection signal S31 is enabled, the voltage level conversion circuit 33 sets the switch signal S32 to LOW level. On the other hand, when the voltage detection signal S31 is disabled, the voltage detection circuit 32 sets the non-inverted signal S311 to HIGH level (for example, the power supply voltage) and sets the inverted signal S312 to LOW level (for example, the ground voltage). At this time, the voltage level conversion circuit 33 sets the switch signal S32 to HIGH level (for example, the power supply voltage) by a complementary operation to the operation for the voltage detection signal S31 in enabled state.

Note that, the control circuit 31 sets the switch signal S32 to LOW level when making the first switch SW3 open and sets the switch signal S32 to HIGH level when making the first switch SW3 close.

Figure 13:
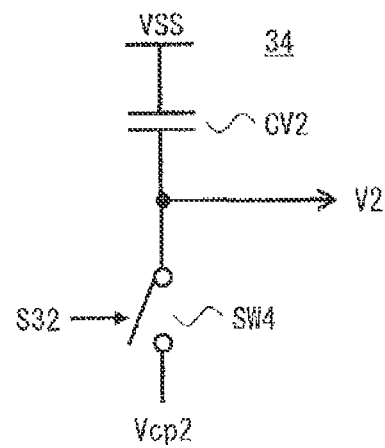
FIG. 13 is a circuit diagram of a voltage hold circuit according to the second embodiment.

FIG. 13 shows a circuit diagram of the voltage hold circuit 34 according to the second embodiment. As shown in FIG. 13, the voltage hold circuit 34 includes a second switch SW4 and a voltage hold capacitor CV2. The second switch SW4 is controlled to open during the period when the output voltage of the negative booster circuit 30 has a larger absolute value than the hold voltage level in accordance with the switch signal S32. On the other hand, the second switch SW4 is controlled to close during the period when the output voltage of the negative booster circuit 30 has a smaller absolute value than the hold voltage level in accordance with the switch signal S32. One end of the voltage hold capacitor CV2 is connected to the boost node at which the output voltage of the negative booster circuit 30 is generated through the second switch SW4, and the other end of the voltage hold capacitor CV2 is connected to the bias terminal to which a specified voltage is supplied. In the example of FIG. 13, Vcp2 is used as a reference symbol indicating the boost node. Further, in the voltage hold circuit 34 shown in FIG. 13, the ground terminal VSS to which the power supply voltage is supplied corresponds to the bias terminal. Then, the voltage hold circuit 34 outputs a voltage at the voltage hold node connecting the voltage hold capacitor CV2 and the second switch SW4 as the second boosted voltage V2.

Figure 14:
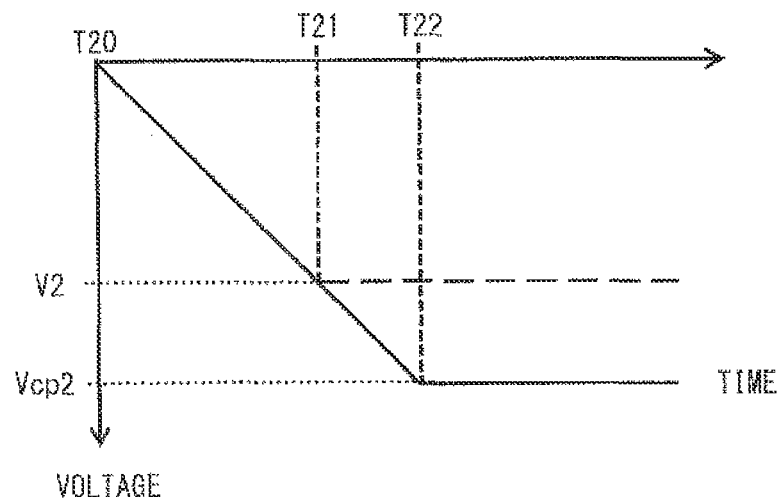
FIG. 14 is a timing chart showing an operation of the semiconductor device according to the second embodiment.

The operation of the semiconductor device 2 according to the second embodiment is described hereinbelow. FIG. 14 is a timing chart showing an operation of the semiconductor device 2 according to the second embodiment. In the example shown in FIG. 14, at timing T20, the negative booster circuit 30 starts the boost operation. Then, the negative booster circuit 30 raises the output voltage and, at timing T21, the output voltage reaches the voltage level held by the voltage hold circuit 34. Thus, at timing T21, the voltage detection circuit 32 switches the voltage detection signal S31 from disabled state to enabled state. In response that the voltage detection signal S31 becomes enabled, the voltage level conversion circuit 33 switches the switch signal S32 from HIGH level to LOW level. Then, at timing T21, the first switch SW3 switches to open in accordance with the switch signal S32. Further, at timing T21, the voltage hold circuit 34 makes the second switch SW4 open and outputs the output voltage at the point of reaching the hold voltage level as the second boosted voltage V2 based on the charges accumulated in the voltage hold capacitor CV2 during the period up to that time.

After that, the negative booster circuit 30 continues the boost operation of the output voltage and, at timing T32, the output voltage reaches the first boosted voltage Vcp2. After timing T22, the semiconductor device 2 outputs the first boosted voltage Vcp2 and the second boosted voltage V2.

As described above, in the semiconductor device 2 according to the second embodiment, the voltage hold circuit 34 outputs the second boosted voltage V2 in the same manner as in the first embodiment, and it is thereby possible to prevent an increase in circuit area. Further, in the semiconductor device 2 according to the second embodiment, the first switch SW3 is controlled to close until the output voltage of the negative booster circuit 30 reaches the hold voltage level. Thus, even if the driving capacity of the voltage hold circuit 34 is set to be low, the rising speed of the second boosted voltage V2 can be high in the semiconductor device 2 according to the second embodiment just like in the first embodiment. Furthermore, in the semiconductor device 2 according to the second embodiment, the control circuit 31 includes the voltage detection circuit 32 and the voltage level conversion circuit 33. It is thereby possible to configure the voltage detection circuit 32 using a circuit element having a low withstand voltage and reduce the circuit area of the voltage detection circuit 32 in the semiconductor device 2 according to the second embodiment just like in the first embodiment.

Third Embodiment

Figure 15:
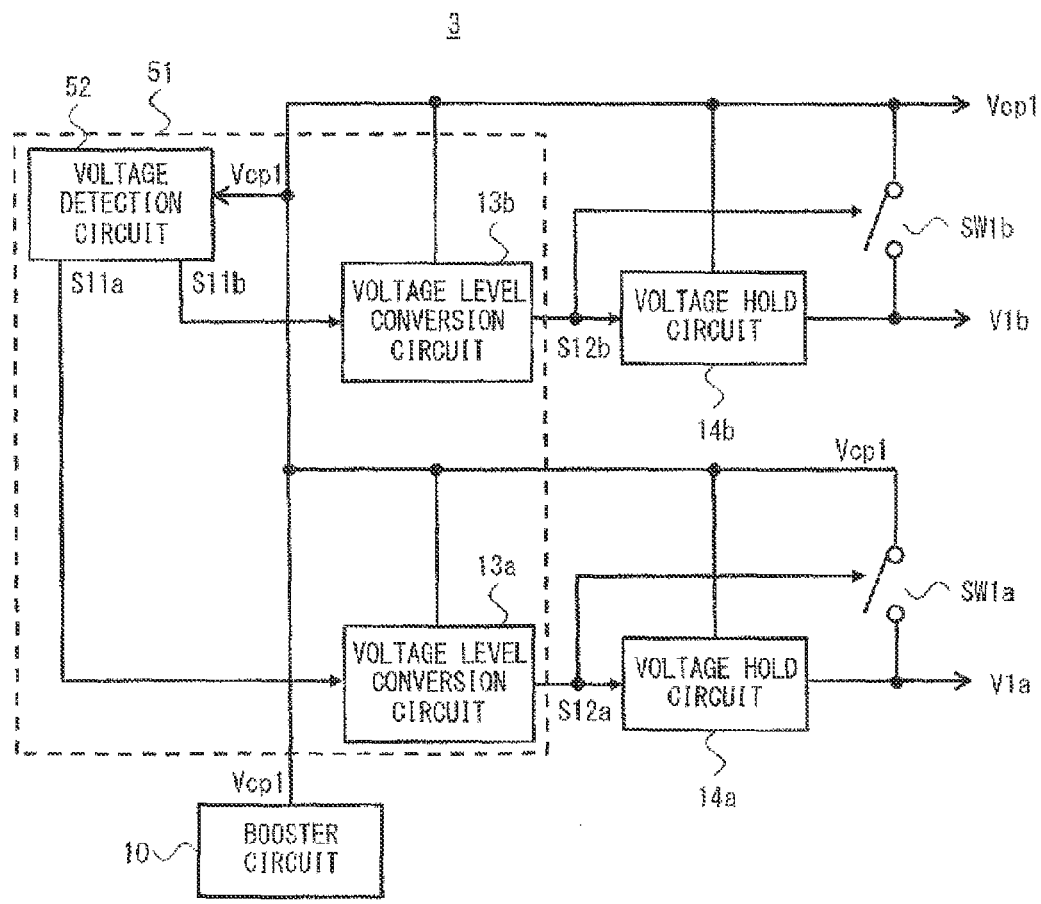
FIG. 15 is a block diagram of a semiconductor device according to a third embodiment.

In a third embodiment, an example of increasing the varieties of boosted voltages generated by the technique related to the semiconductor device 1 according to the first embodiment is described. FIG. 15 shows a block diagram of a semiconductor device 3 according to the third embodiment. Note that, in the semiconductor device 3 according to the third embodiment, the same elements as in the semiconductor device 1 according to the first embodiment are denoted by the same reference symbols as in the first embodiment and not repeatedly described.

As shown in FIG. 15, in the semiconductor device 3 according to the third embodiment, the voltage hold circuit includes a plurality of voltage circuits. In the example shown in FIG. 15, the semiconductor device 3 includes a voltage hold circuit 14a and a voltage hold circuit 14b. Note that the voltage hold circuits 14a and 14b are substantially the same circuit as the voltage hold circuit 14 according to the first embodiment and therefore the detailed description thereof is not repeatedly provided.

Further, in the semiconductor device 3, the first switch includes a plurality of first switches corresponding to the plurality of voltage hold circuits. In the example shown in FIG. 15, the semiconductor device 3 includes a first switch SW1a and a first switch SW1b. Note that the first switches SW1a and SW1b are substantially the same circuit as the first switch SW1 according to the first embodiment and therefore the detailed description thereof is not repeatedly provided.

The semiconductor device 3 according to the third embodiment includes a control circuit 51. Each time the output voltage of the booster circuit 10 reaches a plurality of hold voltage levels that are respectively set for the plurality of voltage hold circuits, the control circuit 51 outputs a switch signal to a pair of the first switch and the voltage hold circuit to which the hold voltage level corresponding to the detected voltage value of the output voltage is set.

To be more specific, in the semiconductor device 3, the voltage hold circuit 14a outputs a second boosted voltage V1a, and the voltage hold circuit 14b outputs a second boosted voltage V1b. The second boosted voltage V1a has a lower voltage value than the second boosted voltage V1b. Thus, the control circuit 51 outputs a switch signal S12a when the output voltage of the booster circuit 10 reaches a hold voltage level corresponding to the second boosted voltage V1a. Further, the control circuit 51 outputs a switch signal S12b when the output voltage of the booster circuit 10 reaches a hold voltage level corresponding to the second boosted voltage V1b.

The control circuit 51 includes a voltage detection circuit 52 and voltage level conversion circuits 13a and 13b. The voltage level conversion circuits 13a and 13b are substantially the same circuit as the voltage level conversion circuit 13 according to the first embodiment and therefore the detailed description thereof is not repeatedly provided.

To the voltage detection circuit 52, voltages corresponding to a plurality of hold voltage levels are set as detection voltages. The voltage detection circuit 52 enables the voltage detection signal S11a when the output voltage of the booster circuit 10 exceeds the lowest voltage among the plurality of detection voltages and enables the voltage detection signal S11b when it exceeds the highest voltage among the plurality of detection voltages.

Figure 16:
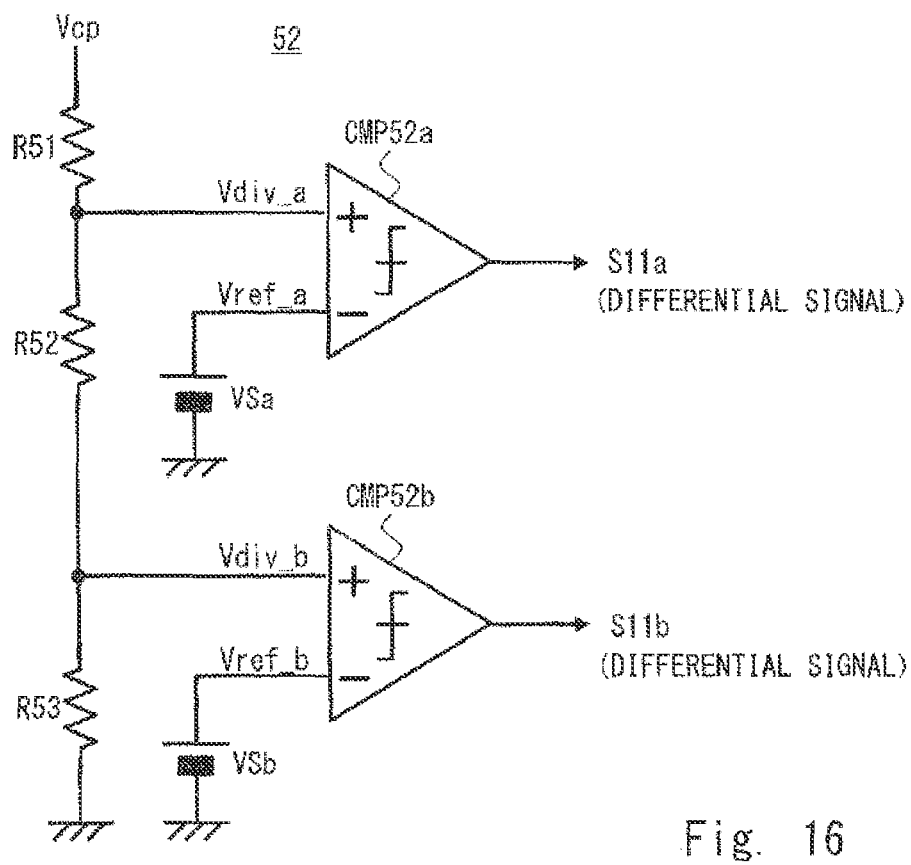
FIG. 16 is a circuit diagram of a voltage detection circuit according to the third embodiment.

FIG. 16 shows a circuit diagram of the voltage detection circuit according to the third embodiment. As shown in FIG. 16, the voltage detection circuit 52 includes comparators CMP52a and CMP52b, reference voltage generators VSa and VSb, and resistors R51, R52 and R53. The resistors R51 to R53 are connected in series between a boost node to which the output voltage of the booster circuit 10 is supplied and a bias terminal to which a specified voltage is supplied. In the example of FIG. 16, Vcp1 is used as a reference symbol indicating the boost node. Further, in the voltage detection circuit 52 shown in FIG. 16, the ground terminal VSS to which a ground voltage is supplied corresponds to the bias terminal.

The reference voltage generator VSa generates a reference voltage Vref_a. The reference voltage generator VSb generates a reference voltage Vref_b. The reference voltage generators VSa and VSb are band gap voltage sources, for example, and output band gap voltages as the reference voltages Vref_a and Vref_b. Note that the voltage values of the reference voltages Vref_a and Vref_b may be the same or different.

The comparator CMP52a compares a divided voltage Vdiv_a that is generated at a connection node connecting the resistor R51 and the resistor R52 with the reference voltage Vref_a and switches the logic level of the voltage detection signal S11a. The comparator CMP52b compares a divided voltage Vdiv_b that is generated at a connection node connecting the resistor R52 and the resistor R53 with the reference voltage Vref_b and switches the logic level of the voltage detection signal S11b. Note that the voltage detection signals S11a and S11b are differential signals. For example, the comparator CMP52a enables the voltage detection signal S11a when the divided voltage Vdiv_a exceeds the reference voltage Vref_a. Further, the comparator CMP52b enables the voltage detection signal S11b when the divided voltage Vdiv_b exceeds the reference voltage Vref_b. In other words, the voltage detection circuit 52 sets the divided voltages Vdiv_a and Vdiv_b at the point when the output voltage of the booster circuit 10 reaches the hold voltage level to the reference voltage Vref_a and Vref_b and thereby detects that the output voltage reaches the hold voltage level. Note that the divided voltage Vref_a can be adjusted by adjusting the ratio of the resistance of the resistor R51 and the combined resistance of the resistors R52 and the R53. Further, the divided voltage Vref_b can be adjusted by adjusting the combined resistance of the resistors R51 and the R52 and the resistance of the resistor R53.

Figure 17:
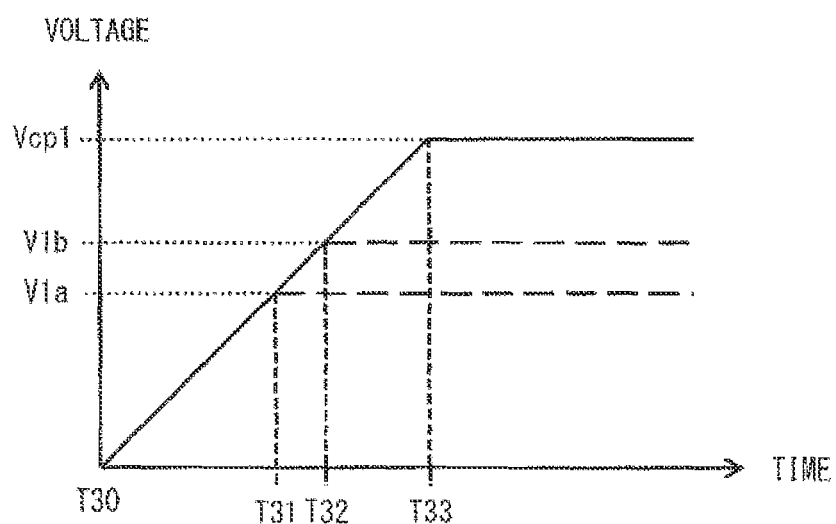
FIG. 17 is a timing chart showing an operation of the semiconductor device according to the third embodiment.

The operation of the semiconductor device 3 according to the third embodiment is described hereinbelow. FIG. 17 is a timing chart showing an operation of the semiconductor device 3 according to the third embodiment. In the example shown in FIG. 17, at timing T30, the booster circuit 10 starts the boost operation. Then, the booster circuit 10 raises the output voltage and, at timing T31, the output voltage reaches the hold voltage level indicating the voltage held by the voltage hold circuit 14a. Thus, at timing T31, the voltage detection circuit 52 switches the voltage detection signal S11a from disabled state to enabled state. In response that the voltage detection signal S11a becomes enabled, the voltage level conversion circuit 13a switches the switch signal S12a from LOW level to HIGH level. Then, at timing T31, the first switch SW1a switches to open in accordance with the switch signal S12a. Further, at timing T31, the voltage hold circuit 14a makes the second switch SW2a (not shown) open and outputs the output voltage at the point of reaching the hold voltage level as the second boosted voltage V1a based on the charges accumulated in the voltage hold capacitor CV1a (not shown) during the period up to that time.

The booster circuit 10 continues the boost operation of the output voltage after timing T31 as well. Then, in the booster circuit 10, at timing T32, the output voltage reaches the hold voltage level indicating the voltage held by the voltage hold circuit 14b. Thus, at timing T32, the voltage detection circuit 52 switches the voltage detection signal S11b from disabled state to enabled state. In response that the voltage detection signal S11*b* becomes enabled, the voltage level conversion circuit 13*b* switches the switch signal S12*b* from LOW level to HIGH level. Then, at timing T32, the first switch SW1*b* switches to open in accordance with the switch signal S12*b*. Further, at timing T32, the voltage hold circuit 14*b* makes the second switch SW2*b* (not shown) open and outputs the output voltage at the point of reaching the hold voltage level as the second boosted voltage V1*b* based on the charges accumulated in the voltage hold capacitor CV1*b* (not shown) during the period up to that time.

After that, the booster circuit 10 continues the boost operation of the output voltage and, at timing T33, the output voltage reaches the first boosted voltage Vcp1. After timing 33, the semiconductor device 3 outputs the first boosted voltage Vcp1 and the second boosted voltages V1*a* and V1*b*.

The layout area of the semiconductor device 3 according to the third embodiment is described hereinbelow. First, FIG. 18 shows a schematic diagram illustrating the layout area of a comparative example of the semiconductor device 3 according to the third embodiment. The semiconductor device of this comparative example includes a second booster circuit and a third booster circuit in place of the voltage hold circuits 14*a* and 14*b* of the semiconductor device 3 according to the third embodiment. As shown in FIG. 18, in the semiconductor device according to this comparative example, the second booster circuit and the third booster circuit with a smaller layout area than the booster circuit 10 (for example, the first booster circuit) are placed.

On the other hand, FIG. 19 shows a schematic diagram illustrating the layout area of the semiconductor device 3 according to the third embodiment. As shown in FIG. 19, the semiconductor device 3 according to the third embodiment includes the voltage hold circuit 14. In FIG. 19, the layout area of the second booster circuit and the third booster circuit of FIG. 18 is shown as an area enclosed by a dotted line for comparison. The voltage hold circuits 14*a* and 14*b* can be placed in a smaller layout area than the second booster circuit and the third booster circuit. Although the second booster circuit and the third booster circuit have a lower current output capacity and a smaller capacitor's capacitance than the first booster circuit, they still require a large number of capacitors, which results in large circuit area. On the other hand, the voltage hold circuits 14*a* and 14*b* according to the third embodiment can be composed of one capacitor and one switch, and therefore the circuit area can be significantly smaller than that of the second booster circuit and the third booster circuit. Further, as shown in FIG. 19, the reduced amount of the layout area is larger in the semiconductor device 3 than in the semiconductor device 1 according to the first embodiment. Specifically, in the semiconductor device according to the first to third embodiments, the reduced amount of the layout area is larger as the number of voltages to be generated increases.

An example of the area reduction is described. For example, the voltage hold circuit can be placed within the area that is about one-tenth the area of the second booster circuit. In this case, the layout area of the semiconductor device that generates three boosted voltages is 3 in the comparative example and 1.2 in the semiconductor device according to the third embodiment. Thus, the semiconductor device according to the third embodiment can be laid out in the area that is about 40% the area of the semiconductor device according to the comparative example. Further, in the case of generating five boosted voltages, the area ratio of the semiconductor device according to the comparative example and the semiconductor device according to the third embodiment is 1.4/5, and the semiconductor device according to the third embodiment can be laid out in the area that is about 28% the area of the semiconductor device according to the comparative example.

Fourth Embodiment

Figure 20:
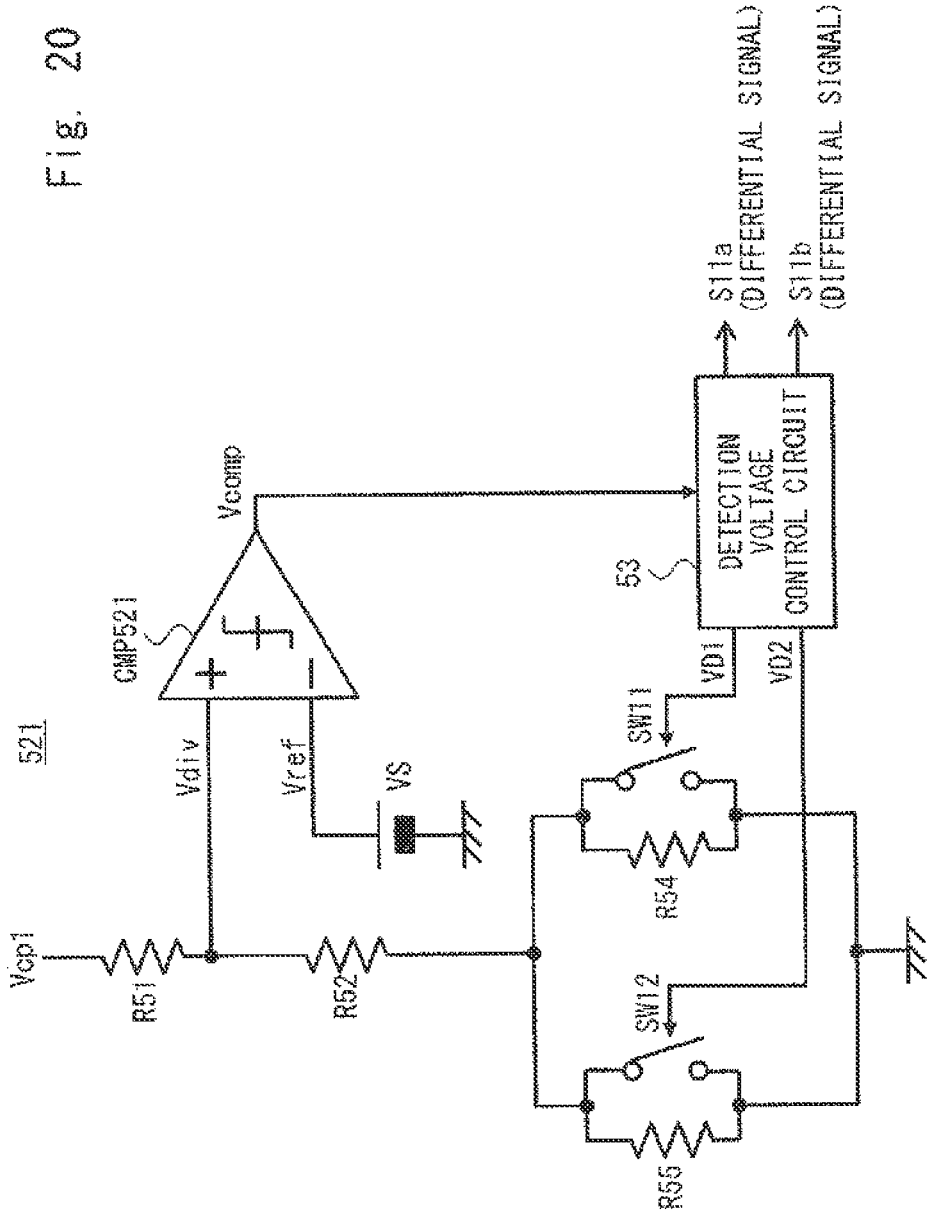
FIG. 20 is a circuit diagram of an alternative example of the voltage detection circuit according to the third embodiment.

In a fourth embodiment, another example of the voltage detection circuit 52 of the semiconductor device 3 according to the third embodiment is described. FIG. 20 shows a block diagram of a voltage detection circuit 521 according to the fourth embodiment. The voltage detection circuit 521 shown in FIG. 20 detects that the output voltage of the booster circuit 10 exceeds two hold voltage levels using one comparator CMP521 and a detection voltage control circuit 53.

As shown in FIG. 20, the voltage detection circuit 521 includes the comparator CMP521, the reference voltage generator VS, the detection voltage control circuit 53, resistors R51, R52, R54 and R55, and switches SW11 and SW12. In the voltage detection circuit 521, the resistor R51 corresponds to the first resistor, the resistor R52 corresponds to the second resistor, and the resistors R54 and R55 and the switches SW11 and SW12 constitute a third resistor.

The resistors R51 and R52 are connected in series between the boost node and the bias terminal to which a specified voltage is supplied. In the example of FIG. 20, Vcp1 is used as a reference symbol indicating the boost node. Further, in the voltage detection circuit 521 shown in FIG. 20, the ground terminal VSS to which a ground voltage is supplied corresponds to the bias terminal.

The third resistor is connected in series with the first and second resistors. The third resistor includes a plurality of resistors (for example, the resistors R54 and R55) connected in parallel. The switch SW11 is connected in parallel with the resistor R54, and the switch SW12 is connected in parallel with the resistor R55. The resistors R54 and R55 are resistors having different resistance values. Thus, the third resistor has a different resistance value depending on which of the switch SW11 and the switch SW12 is in close state.

The reference voltage generator VS generates a reference voltage Vref. The reference voltage generator VS is a band gap voltage source, for example, and outputs a band gap voltage as the reference voltage Vref.

The comparator CMP521 compares a detection target voltage (for example, a divided voltage Vdiv) that is generated at a connection node of the resistor R51 and the resistor R52 with the preset reference voltage Vref and switches the logic level of the detection signal Vcomp.

The detection voltage control circuit 53 enables one of the plurality of switch signals when the detection signal Vcomp that is output from the comparator CMP521 is enabled. Further, the detection voltage control circuit 53 switches a resistor to be short-circuited among a plurality of resistors included in the third resistor at the same time as enabling one of the plurality of switch signals.

To be more specific, when the output voltage of the booster circuit 10 is lower than the lowest voltage of a plurality of detection voltages, the resistor R54 is made to function as a resistor and the resistor R55 is short-circuited by resistor switch signals VD1 and VD2. Then, when the output voltage of the booster circuit 10 exceeds the lowest voltage of a plurality of detection voltages, the comparator CMP521 enables the detection signal Vcomp. In response that the detection signal Vcomp becomes enabled, the detection voltage control circuit 53 enables the voltage detection signal S11*a*. Further, in response that the detection signal Vcomp becomes enabled, the detection voltage control circuit 53 makes the resistor R54 short-circuited and makes the resistor R55 function as a resistor by the resistor switch signals VD1 and VD2. The resistance value of the third resistor is thereby reduced, and the divided voltage Vdiv is lowered and the detection signal Vcomp that is output from the comparator CMP521 becomes disabled. At this time, the detection voltage control circuit 53 maintains the voltage detection signal S11a in enabled state regardless of the state of the detection signal Vcomp.

After that, when the output voltage of the booster circuit 10 exceeds the highest voltage of a plurality of detection voltages, the comparator CMP521 enables the detection signal Vcomp. In response that the detection signal Vcomp becomes enabled, the detection voltage control circuit 53 enables the voltage detection signal S11b. At this time, the detection voltage control circuit 53 maintains the state of the resistor switch signals VD1 and VD2 if the detection of the voltages to be detected is completed.

Note that the divided voltage Vdiv can be adjusted by adjusting the ratio of the resistance of the resistor R51 and the combined resistance of the resistor R52 and R54 and the ratio of the resistance of the resistor R51 and the combined resistance of the resistor R52 and R55.

Figure 21:
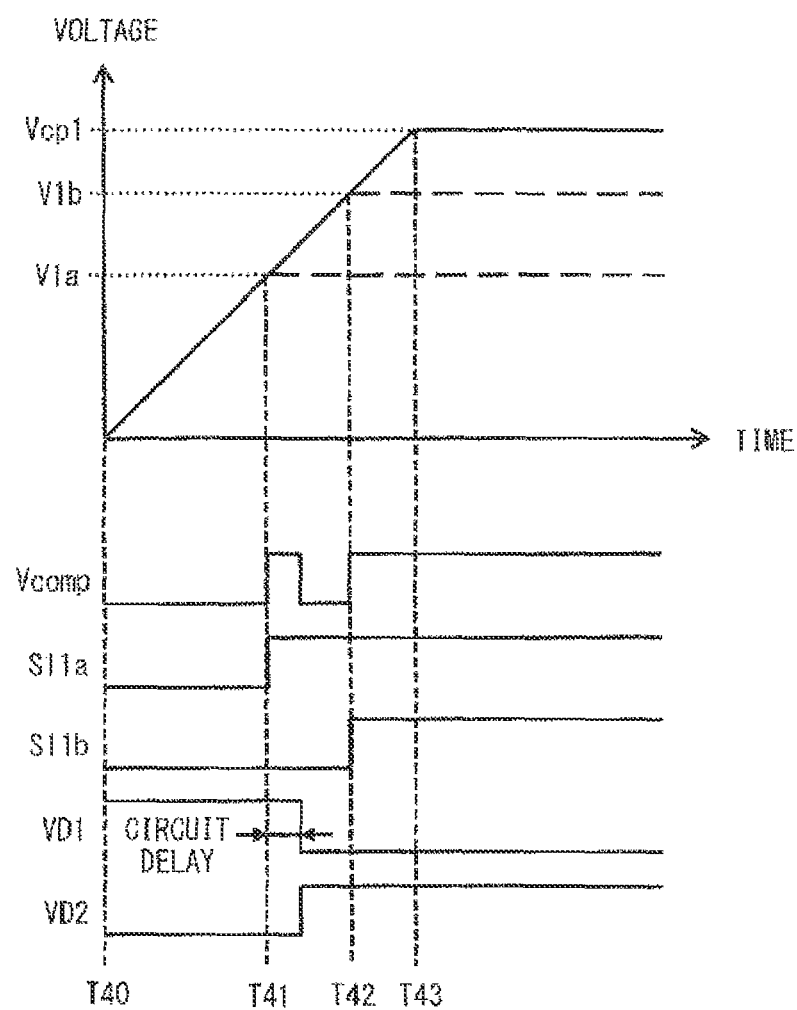
FIG. 21 is a timing chart showing an operation of a semiconductor device including the voltage detection circuit shown in FIG. 20.

An operation of the semiconductor device that includes the voltage detection circuit shown in FIG. 20 is described hereinafter. FIG. 21 is a timing chart showing the operation of the semiconductor device that includes the voltage detection circuit shown in FIG. 20.

As shown in FIG. 21, at timing T40, the booster circuit 10 in the semiconductor device starts the boost operation. Then, the booster circuit 10 raises the output voltage and, at timing T41, the output voltage reaches the hold voltage level indicating the voltage held by the voltage hold circuit 14a. Thus, at timing T41, the comparator CMP521 enables the detection signal Vcomp. Further, in response that the detection signal Vcomp becomes enabled, the detection voltage control circuit 53 switches the voltage detection signal S11a from disabled state to enabled state. Then, in response that the voltage detection signal S11a becomes enabled, the voltage level conversion circuit 13a switches the switch signal S12a from LOW level to HIGH level. Then, at timing T41, the first switch SW1a switches to open in accordance with the switch signal S12a. Further, at timing T41, the voltage hold circuit 14a makes the second switch SW2a (not shown) open and outputs the output voltage at the point of reaching the hold voltage level as the second boosted voltage V1a based on the charges accumulated in the voltage hold capacitor CV1a (not shown) during the period up to that time. Further, after a specified circuit delay time, the detection voltage control circuit 53 switches the logic level of the resistor switch signals VD1 and VD2 and switches the resistance value of the third resistor. Because the voltage of the divided voltage Vdiv is lowered in response to the switching of the logic level of the resistor switch signals VD1 and VD2, the detection signal Vcomp that is output from the comparator CMP521 switches from enabled state to disabled state.

The booster circuit 10 continues the boost operation of the output voltage after timing T41 as well. Then, in the booster circuit 10, at timing T42, the output voltage reaches the hold voltage level indicating the voltage held by the voltage hold circuit 14b. Thus, at timing T42, the detection signal Vcomp that is output from the comparator CMP521 is enabled. In response that the detection signal Vcomp becomes enabled, the detection voltage control circuit 53 switches the voltage detection signal S11b from disabled state to enabled state. Then, in response that the voltage detection signal S11b becomes enabled, the voltage level conversion circuit 13b switches the switch signal S12b from LOW level to HIGH level. Then, at timing T42, the first switch SW1b switches to open in accordance with the switch signal S12b. Further, at timing T42, the voltage hold circuit 14b makes the second switch SW2a (not shown) open and outputs the output voltage at the point of reaching the hold voltage level as the second boosted voltage V1b based on the charges accumulated in the voltage hold capacitor CV1b (not shown) during the period up to that time. Note that, at timing T42, the detection voltage control circuit 53 maintains the logic level of the resistor switch signals VD1 and VD2.

After that, the booster circuit 10 continues the boost operation of the output voltage and, at timing T43, the output voltage reaches the first boosted voltage Vcp1. After timing T43, the semiconductor device 3 outputs the first boosted voltage Vcp1 and the second boosted voltages V1a and V1b.

Figure 22:
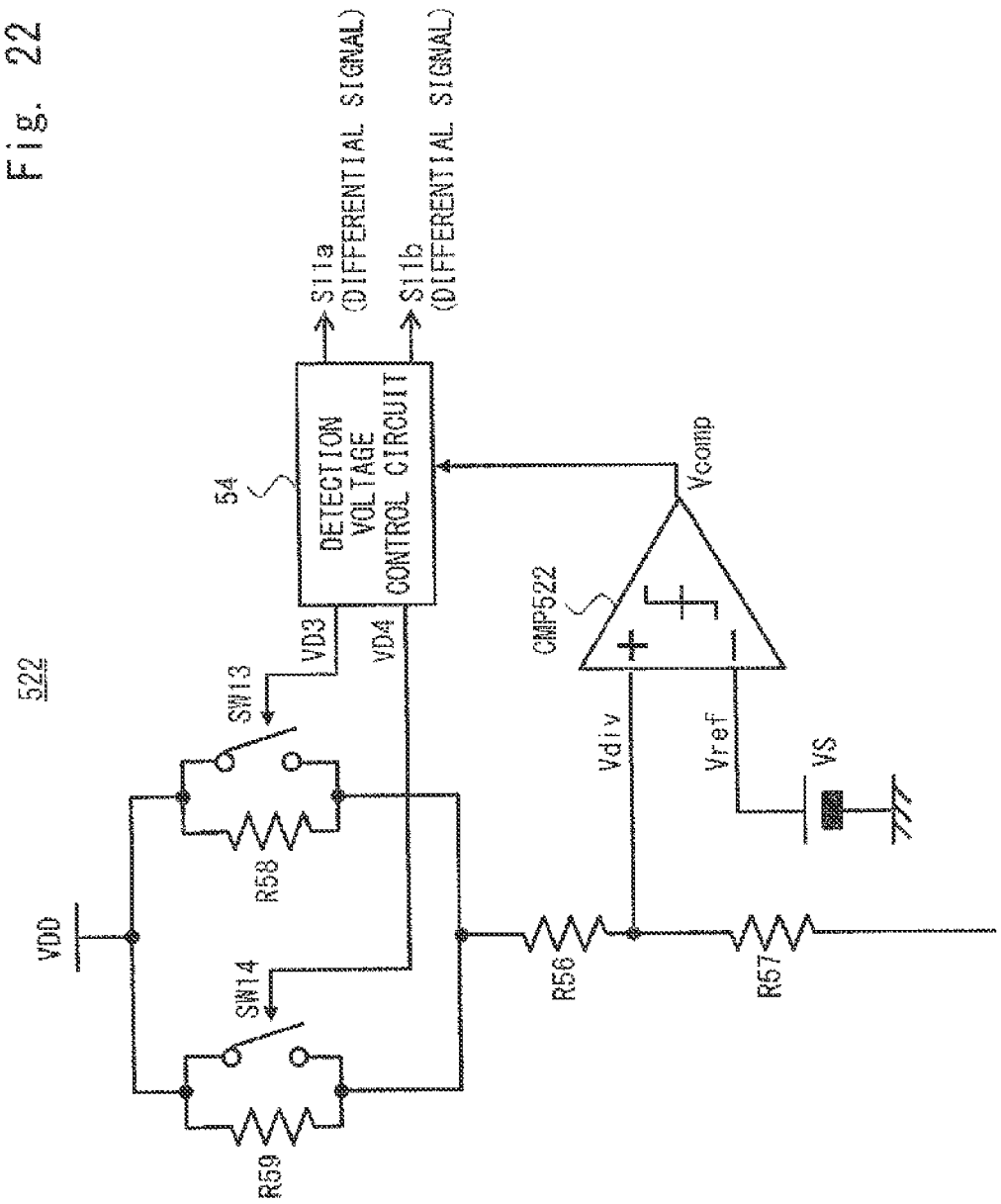
FIG. 22 is a circuit diagram of a voltage detection circuit in the case of applying the voltage detection circuit shown in FIG. 20 to a semiconductor device including a negative booster circuit.

It should be noted that a circuit that performs the same circuit operation as the voltage detection circuit 521 may be applied to a semiconductor device that includes a negative booster circuit. An example of a voltage detection circuit 522 that supports a negative booster circuit is described. FIG. 22 is a circuit diagram of a voltage detection circuit in the case of applying the voltage detection circuit shown in FIG. 20 to a semiconductor device including a negative booster circuit.

As shown in FIG. 22, the voltage detection circuit 522 includes a comparator CMP522, the reference voltage generator VS, a detection voltage control circuit 54, resistors R56, R57, R58 and R59, and switches SW13 and SW14. In the voltage detection circuit 522, the resistor R57 corresponds to the first resistor, the resistor R56 corresponds to the second resistor, and the resistors R58 and R59 and the switches SW13 and SW14 constitute a third resistor.

The resistors R56 and R57 are connected in series between the boost node and the bias terminal to which a specified voltage is supplied. In the example of FIG. 22, Vcp2 is used as a reference symbol indicating the boost node. Further, in the voltage detection circuit 522 shown in FIG. 22, the ground terminal VSS to which the power supply voltage is supplied corresponds to the bias terminal.

The third resistor is connected in series with the first and second resistors. The third resistor includes a plurality of resistors (for example, the resistors R58 and R59) connected in parallel. The switch SW13 is connected in parallel with the resistor R58, and the switch SW14 is connected in parallel with the resistor R59. The resistors R58 and R59 are resistors having different resistance values. Thus, the third resistor has a different resistance value depending on which of the switch SW13 and the switch SW13 is in close state.

The reference voltage generator VS generates a reference voltage Vref. The reference voltage generator VS is a band gap voltage source, for example, and outputs a band gap voltage as the reference voltage Vref.

The comparator CMP522 compares a detection target voltage (for example, a divided voltage Vdiv) that is generated at a connection node of the resistor R56 and the resistor R57 with the preset reference voltage Vref and switches the logic level of the detection signal Vcomp.

The detection voltage control circuit 54 enables one of the plurality of switch signals when the detection signal Vcomp that is output from the comparator CMP521 is enabled. Further, the detection voltage control circuit 54 switches a resistor to be short-circuited among a plurality of resistors included in the third resistor.

To be more specific, when the output voltage of the negative booster circuit 30 is higher than the highest voltage of a plurality of detection voltages, the resistor R58 is made to function as a resistor and the resistor R59 is short-circuited by resistor switch signals VD1 and VD2. Then, when the output voltage of the negative booster circuit 30 exceeds the highest voltage of a plurality of detection voltages, the comparator CMP522 enables the detection signal Vcomp. In response that the detection signal Vcomp becomes enabled, the detection voltage control circuit 54 enables the voltage detection signal S31a. Further, in response that the detection signal Vcomp becomes enabled, the detection voltage control circuit 54 makes the resistor R58 short-circuited and makes the resistor R59 function as a resistor by the resistor switch signals VD1 and VD2. The resistance value of the third resistor is thereby increased, and the divided voltage Vdiv is lowered and the detection signal Vcomp that is output from the comparator CMP522 becomes disabled. At this time, the detection voltage control circuit 54 maintains the voltage detection signal S31a in enabled state regardless of the state of the detection signal Vcomp.

After that, when the output voltage of the negative booster circuit 30 exceeds the lowest voltage of a plurality of detection voltages, the comparator CMP522 enables the detection signal Vcomp. In response that the detection signal Vcomp becomes enabled, the detection voltage control circuit 54 enables the voltage detection signal S31b. At this time, the detection voltage control circuit 54 maintains the state of the resistor switch signals VD1 and VD2 if the detection of the voltages to be detected is completed.

Note that the divided voltage Vdiv can be adjusted by adjusting the ratio of the resistance of the resistor R56 and the combined resistance of the resistor R57 and R58 and the ratio of the resistance of the resistor R56 and the combined resistance of the resistor R57 and R59.

It is obvious from the above description that the voltage detection circuit 52 used in the third embodiment is not limited to the configuration shown in FIG. 16 and various circuit examples may be taken.

Fifth Embodiment

Figure 23:
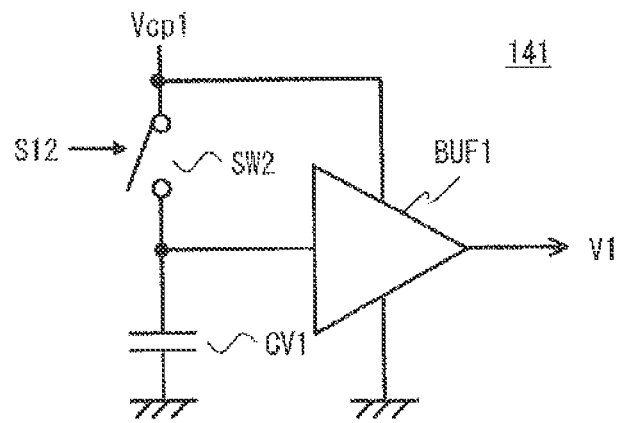
FIG. 23 is a circuit diagram showing a first alternative example of a voltage level conversion circuit according to a fifth embodiment.

In a fifth embodiment, another example of the voltage hold circuit 14 of the semiconductor device according to the first embodiment is described. FIG. 23 is a circuit diagram of a voltage level conversion circuit 141 according to the fifth embodiment. A voltage hold circuit 141 is a first example of an alternative example of the voltage hold circuit 14 described in the first embodiment.

As shown in FIG. 23, the voltage hold circuit 141 according to the fifth embodiment has a configuration in which a buffer BUF1 is added to the voltage hold circuit 14. The buffer BUF1 outputs the second boosted voltage V1 based on a voltage at a voltage hold node connecting the second switch SW2 and the voltage hold capacitor CV1.

Figure 24:
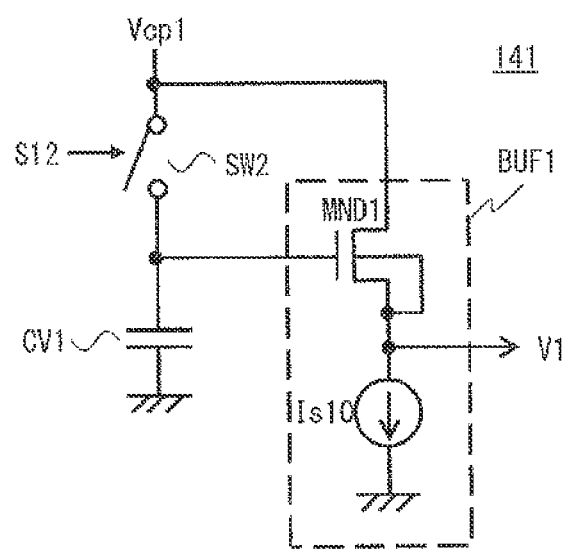
FIG. 24 is a circuit diagram showing an example of a detailed circuit of the voltage level conversion circuit shown in FIG. 23.

FIG. 24 shows an example of a detailed circuit of the voltage level conversion circuit shown in FIG. 23. In the example shown in FIG. 24, the buffer BUF1 is implemented using a source follower circuit. The source follower circuit outputs the second boosted voltage based on the voltage at the voltage hold node. To be more specific, the source follower circuit includes a first transistor MND1 and a current source Is10. The voltage at the voltage hold node is input to the control terminal (for example, the gate) of the first transistor MND1, the drain of the first transistor MND1 is connected to the boost node, and the source of the first transistor MND1 is connected to the current source Is10. The current source Is10 is connected between the first transistor MND1 and the ground terminal VSS. The current source Is10 supplies an operating current to the first transistor MND1. Then, the buffer BUF1 outputs the second boosted voltage V1 from the source of the first transistor MND1.

The buffer BUF1 has high input impedance and high driving capability. In this manner, by outputting the second boosted voltage V1 through the buffer BUF1, it is possible to prevent the leakage of charges accumulated in the voltage hold capacitor CV1. Further, by using the buffer BUF1, it is possible to enhance the driving capability of the voltage hold circuit.

Figure 25:
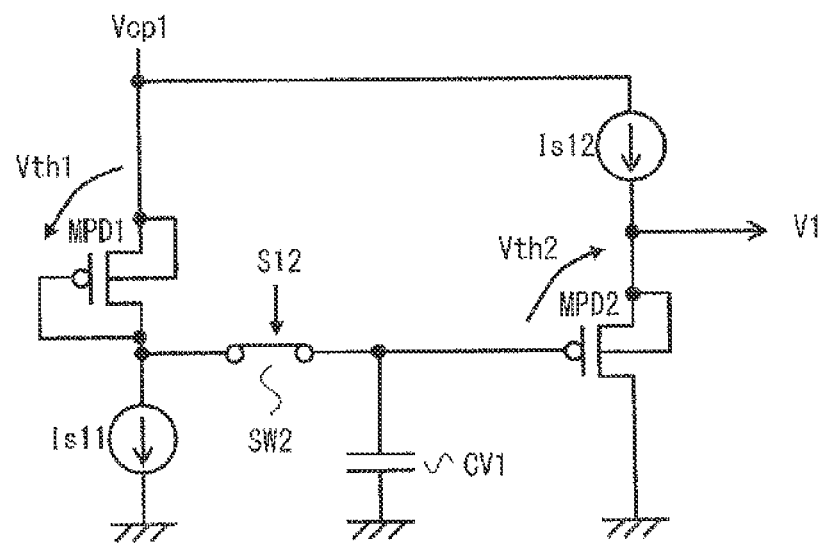
FIG. 25 is a circuit diagram showing a second alternative example of a voltage level conversion circuit according to the fifth embodiment.

In the case of using the source follower circuit shown in FIG. 24 as the buffer BUF1, a voltage drop corresponding to the threshold voltage of the first transistor MND1 occurs between the voltage at the voltage hold node and the second boosted voltage. Thus, an alternative example of the voltage hold circuit 14 that eliminates the voltage drop is described. FIG. 25 is a circuit diagram of a voltage level conversion circuit 142 according to the fifth embodiment. A voltage hold circuit 142 is a second example of an alternative example of the voltage hold circuit 14.

As shown in FIG. 25, the voltage hold circuit 142 has a configuration in which a first transistor MPD2, a second transistor MPD1, and current sources Is11 and Is12 are added to the voltage hold circuit 14.

The drain of the first transistor MPD2 is connected to the ground terminal, a voltage at the voltage hold node is supplied to the control terminal (for example, the gate) of the first transistor MPD2, and the source of the first transistor MPD2 is connected to the boost node through the current source Is12. Then, the first transistor MPD2 outputs the second boosted voltage V1 from the source. Thus, the first transistor MPD2 and the current source Is12 constitute a source follower circuit.

The second transistor MPD1 is a transistor of the same conduction type as the first transistor MPD2 and is diode-connected. The source of the second transistor MPD1 is connected to the boost node, the gate of the second transistor MPD1 is connected to the drain, and the drain of the second transistor MPD1 is connected to the second switch SW2. Thus, in the voltage hold circuit 142, the second switch SW2 is connected to the boost node through the second transistor MPD1. Further, the current source Is11 is connected between the source of the second transistor MPD1 and the ground terminal VSS. The current source Is11 supplies the operating current to the second transistor MPD1.

In the voltage hold circuit 142, a voltage obtained by dropping the output voltage of the booster circuit 10 by the amount of the threshold voltage of the second transistor MPD1 is supplied to the voltage hold node connecting the second switch SW2 and the voltage hold capacitor CV1. Then, the first transistor MPD2 raises the voltage at the voltage hold node by the amount of the threshold voltage of its transistor and outputs the second boosted voltage V1. At this time, because the first transistor MPD2 and the second transistor MPD1 are transistors of the same conduction type, the threshold voltage is the same. Accordingly, the gap of the second boosted voltage V1 that is output from the voltage hold circuit 142 due to the threshold voltage of the transistor is eliminated. Further, by using the transistors of the same conduction type, the variations of the threshold voltage with respect to the substrate temperature can be matched. Therefore, in the voltage hold circuit 142, the value of the second boosted voltage V1 can be stable without dependent on the substrate temperature.

Sixth Embodiment

Figure 26:
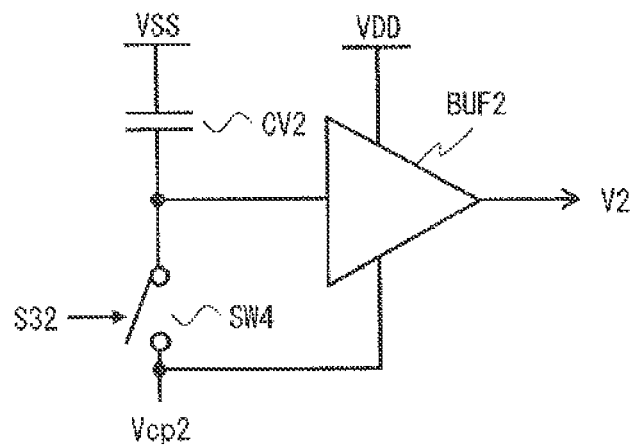
FIG. 26 is a circuit diagram showing a first alternative example of a voltage level conversion circuit according to a sixth embodiment.

In a sixth embodiment, another example of the voltage hold circuit 34 of the semiconductor device according to the second embodiment is described. FIG. 26 shows a block diagram of a voltage level conversion circuit 341 according to the sixth embodiment. A voltage hold circuit 341 is a first example of an alternative example of the voltage hold circuit 34 described in the second embodiment.

As shown in FIG. 26, the voltage hold circuit 341 according to the sixth embodiment has a configuration in which a buffer BUF2 is added to the voltage hold circuit 34. The buffer BUF2 outputs the second boosted voltage V2 based on a voltage at a voltage hold node connecting the second switch SW4 and the voltage hold capacitor CV2.

Figure 27:
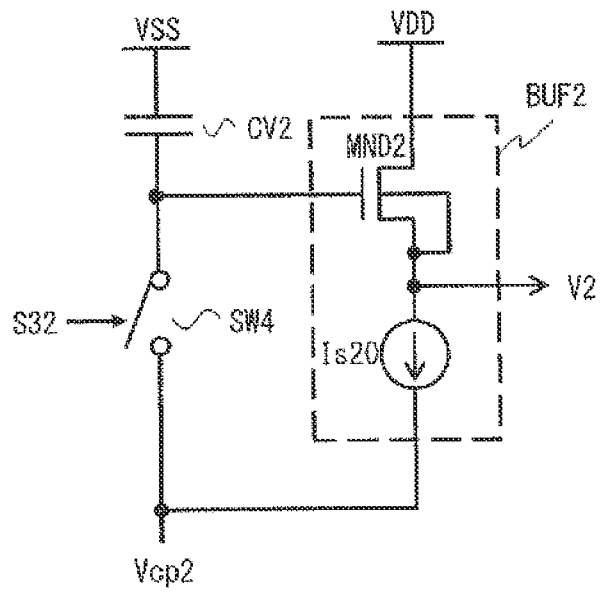
FIG. 27 is a circuit diagram showing an example of a detailed circuit of the voltage level conversion circuit shown in FIG. 26.

FIG. 27 shows an example of a detailed circuit of the voltage level conversion circuit shown in FIG. 26. In the example shown in FIG. 27, the buffer BUF2 is implemented using a source follower circuit. The source follower circuit outputs the second boosted voltage based on the voltage at the voltage hold node. To be more specific, the source follower circuit includes a first transistor MND2 and a current source Is20. The voltage at the voltage hold node is input to the control terminal (for example, the gate) of the first transistor MND2, the drain of the first transistor MND2 is connected to the boost node, and the source of the first transistor MND2 is connected to the current source Is20. The current source Is20 is connected between the first transistor MND2 and the boost node. The current source Is20 supplies an operating current to the first transistor MND2. Then, the buffer BUF2 outputs the second boosted voltage V1 from the source of the first transistor MND2.

The buffer BUF2 has high input impedance and high driving capability. In this manner, by outputting the second boosted voltage V1 through the buffer BUF2, it is possible to prevent the leakage of charges accumulated in the voltage hold capacitor CV2. Further, by using the buffer BUF2, it is possible to enhance the driving capability of the voltage hold circuit.

Figure 28:
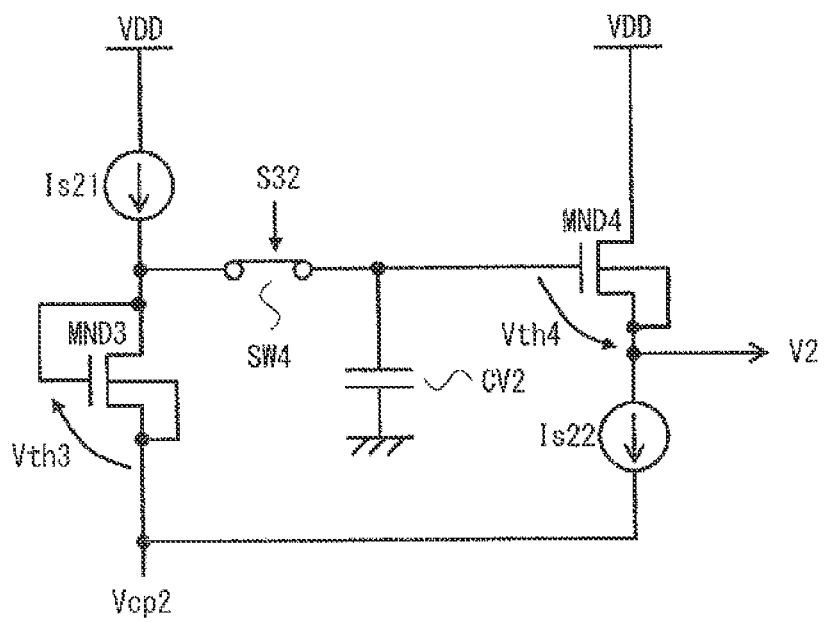
FIG. 28 is a circuit diagram showing a second alternative example of a voltage level conversion circuit according to the sixth embodiment.

In the case of using the source follower circuit shown in FIG. 27 as the buffer BUF2, a voltage drop corresponding to the threshold voltage of the first transistor MND2 occurs between the voltage at the voltage hold node and the second boosted voltage. Thus, an alternative example of the voltage hold circuit 34 that eliminates the voltage drop is described. FIG. 28 is a circuit diagram of a voltage level conversion circuit 342 according to the sixth embodiment. A voltage hold circuit 342 is a second example of an alternative example of the voltage hold circuit 34.

As shown in FIG. 28, the voltage hold circuit 342 has a configuration in which a first transistor MND4, a second transistor MND3, and current sources Is21 and Is22 are added to the voltage hold circuit 34.

The drain of the first transistor MND4 is connected to the power supply terminal VDD, a voltage at the voltage hold node is supplied to the control terminal (for example, the gate) of the first transistor MND4, and the source of the first transistor MND4 is connected to the boost node through the current source Is22. Then, the first transistor MND4 outputs the second boosted voltage V1 from the source. Thus, the first transistor MND4 and the current source Is22 constitute a source follower circuit.

The second transistor MND3 is a transistor of the same conduction type as the first transistor MND4 and is diode-connected. The source of the second transistor MND3 is connected to the boost node, the gate of the second transistor MND3 is connected to the drain, and the drain of the second transistor MND3 is connected to the second switch SW2. Thus, in the voltage hold circuit 342, the second switch SW2 is connected to the boost node through the second transistor MND3. Further, the current source Is21 is connected between the source of the second transistor MND3 and the power supply terminal VDD. The current source Is21 supplies the operating current to the second transistor MND3.

In the voltage hold circuit 342, a voltage obtained by raising the output voltage of the negative booster circuit 30 by the amount of the threshold voltage of the second transistor MND3 is supplied to the voltage hold node connecting the second switch SW2 and the voltage hold capacitor CV2. Then, the first transistor MND4 drops the voltage at the voltage hold node by the amount of the threshold voltage of its transistor and outputs the second boosted voltage V1. At this time, because the first transistor MND4 and the second transistor MND3 are transistors of the same conduction type, the threshold voltage is the same. Accordingly, the gap of the second boosted voltage V1 that is output from the voltage hold circuit 342 due to the threshold voltage of the transistor is eliminated. Further, by using the transistors of the same conduction type, the variations of the threshold voltage with respect to the substrate temperature can be matched. Therefore, in the voltage hold circuit 342, the value of the second boosted voltage V1 can be stable without dependent on the substrate temperature.

Seventh Embodiment

Figure 29:
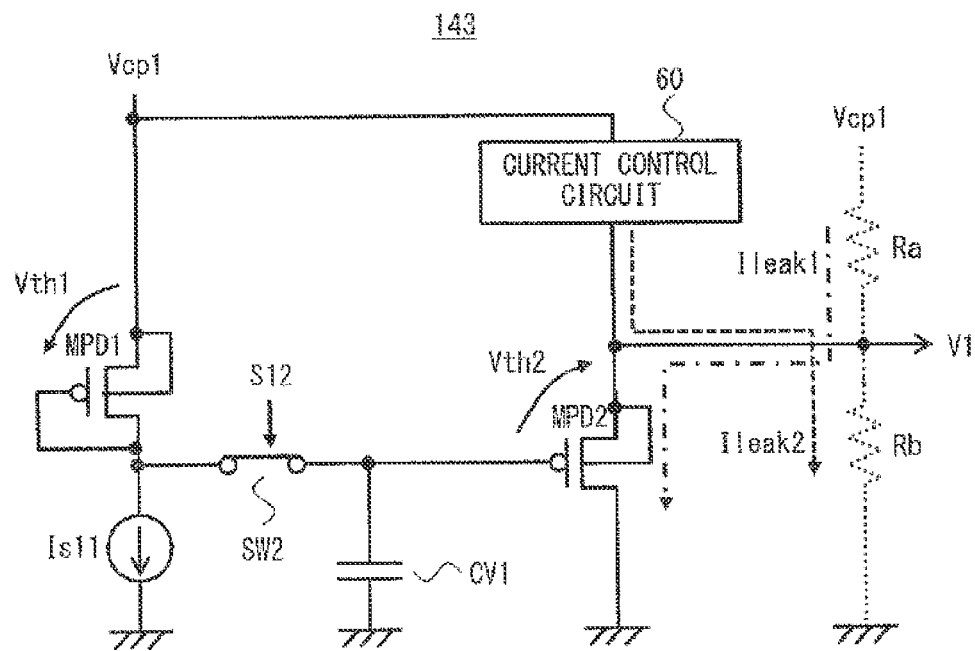
FIG. 29 is a circuit diagram of a voltage level conversion circuit according to a seventh embodiment.

In a seventh embodiment, an alternative example of the voltage hold circuit 142 according to the fifth embodiment is described. FIG. 29 is a circuit diagram of a voltage hold circuit 143 according to the seventh embodiment. The voltage hold circuit 143 shown in FIG. 29 is also an alternative example of the voltage hold circuit 14 according to the first embodiment.

As shown in FIG. 29, the voltage hold circuit 143 includes a current control circuit 60 in place of the current source Is12. The current control circuit 60 generates the operating current of the first transistor MPD2. Further, the amount of current to be output from the current control circuit 60 is controlled in accordance with a preset value.

In FIG. 29, resistors Ra and Rb are shown as load circuits to be driven by the voltage hold circuit 143. The resistors Ra and Rb are connected in series between the boost node and the ground terminal VSS. Further, a second boosted voltage V2 is supplied to a node connecting the resistor Ra and the resistor Rb. In the case where such load circuits are connected, the leakage current of the load circuits flows through two paths depending on the resistances of the resistor Ra and the resistor Rb. For example, when the resistor Ra has a significantly lower resistance value than the resistor Rb, the leakage current flows through a path from the boost node, the resistor Ra and the first transistor MPD2 (the path indicated by Ileak1 in FIG. 29). On the other hand, when the resistor Rb has a significantly lower resistance value than the resistor Ra, the leakage current flows through a path from the current control circuit 60, the resistor Rb and the ground terminal VSS (the path indicated by Ileak2 in FIG. 29).

In the case where the leakage current flows through the path Ileak1, if ON-current of the first transistor MPD2 is sufficiently larger than the leakage current, the leakage current is consumed by the first transistor MPD2. Thus, when the leakage current flows through the path Ileak1, no adverse effect is caused on the voltage value of the second boosted voltage V1.

On the other hand, in the case where the leakage current flows through the path Ileak2, it is necessary that the current output from the current control circuit 60 is larger than the leakage current flowing to the resistor Rb. This is because, when the current output from the current control circuit 60 is smaller than the leakage current flowing to the resistor Rb, a problem occurs that the second boosted voltage V1 drops to the voltage at which the two currents match.

Figure 30:
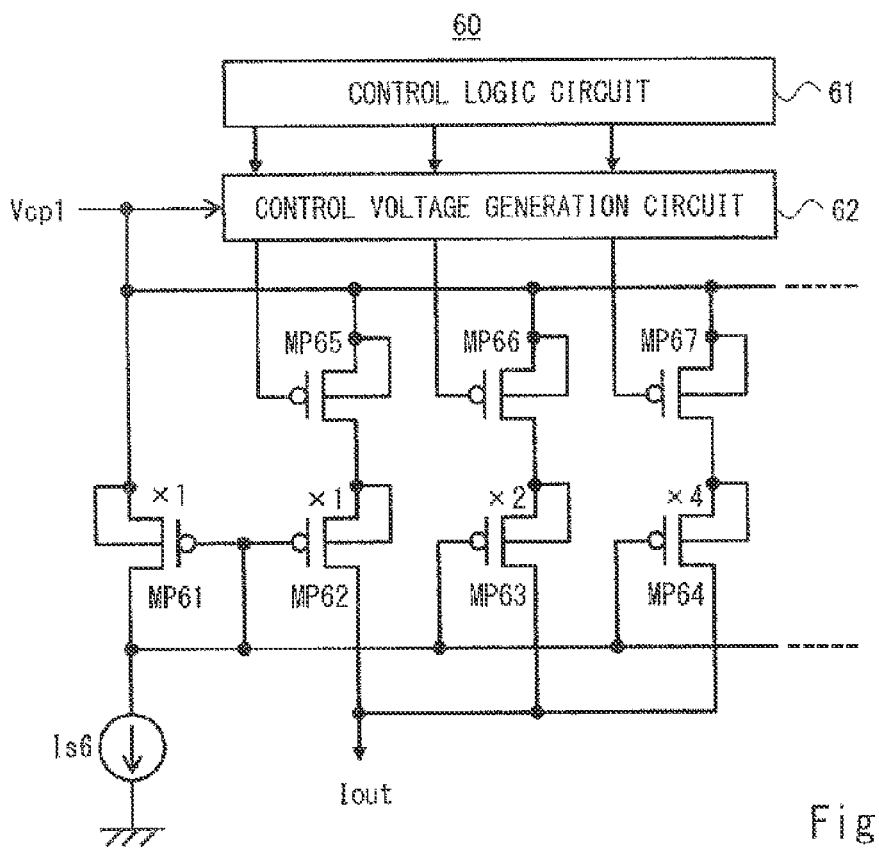
FIG. 30 is a circuit diagram showing an example of a detailed circuit of a current control circuit according to the seventh embodiment.

For this reason, in the voltage hold circuit 143, the current output from the current control circuit 60 is controlled to prevent the drop of the voltage of the second boosted voltage V1. FIG. 30 is a detailed circuit diagram of the current control circuit 60.

As shown in FIG. 30, the current control circuit 60 includes a control logic circuit 61, a control voltage generation circuit 62, a current source Is6, and PMOS transistors MP61 to MP67. The control logic circuit 61 is a nonvolatile storage device and stores a set value of the current output from the current control circuit 60. The control voltage generation circuit 62 operates on the basis of the first boosted voltage and generates a control signal based on the set value stored in the control logic circuit 61.

The PMOS transistors MP61 to MP66 form a current mirror circuit. To be more specific, the gate and the drain of the PMOS transistor MP61 are connected in common. Further, a current source Is6 is connected between the drain of the PMOS transistor MP61 and the ground terminal VSS. The current source Is6 outputs a current having the smallest current value of the current Iout that is output from the current control circuit 60. The gates of the PMOS transistors MP62 to MP64 are connected in common to the gate of the PMOS transistor MP61. Further, the source of the PMOS transistor MP61 is connected to each other. Further, the transistors are set so that, when the transistor size of the PMOS transistor MP61 is 1, the transistor size of the PMOS transistor MP62 is 1, the transistor size of the PMOS transistor MP63 is 2, and the transistor size of the PMOS transistor MP64 is 4.

The PMOS transistor MP65 is connected between the source of the PMOS transistor MP62 and the boost node. The PMOS transistor MP66 is connected between the source of the PMOS transistor MP63 and the boost node. The PMOS transistor MP67 is connected between the source of the PMOS transistor MP64 and the boost node. A control signal is supplied from the control voltage generation circuit 62 to the gates of the PMOS transistors MP65 to MP67.

The control signal is three bits in the example shown in FIG. 30. Then, by the transistor that is controlled to be conductive among the PMOS transistors MP65 to MP67, a current flows through at least one of the PMOS transistors MP62 to MP64. Specifically, when only the PMOS transistor MP65 is controlled to be conductive, a current flows through only the PMOS transistor MP62, and the current value of the current Iout is equal to the current value of the current that is output from the current source Is6. On the other hand, when the PMOS transistors MP65 and MP66 are controlled to be conductive, a current flows through the PMOS transistors MP62 and MP63, and the current value of the current Iout is three times the current value of the current that is output from the current source Is6.

In this manner, in the current control circuit 60, the current to be output can be controlled in accordance with the set value that is stored in the control logic circuit 61. As described above, the current to be output from the current control circuit 60 needs to be larger than the leakage current that flows to the resistor Rb. The set value that allows the current control circuit 60 to output a current larger than the current that flows to the resistor Rb can be calculated by shipping test or estimation in design phase. The set value that is calculated in such a way needs to be set to the control logic circuit 61.

Figure 31:
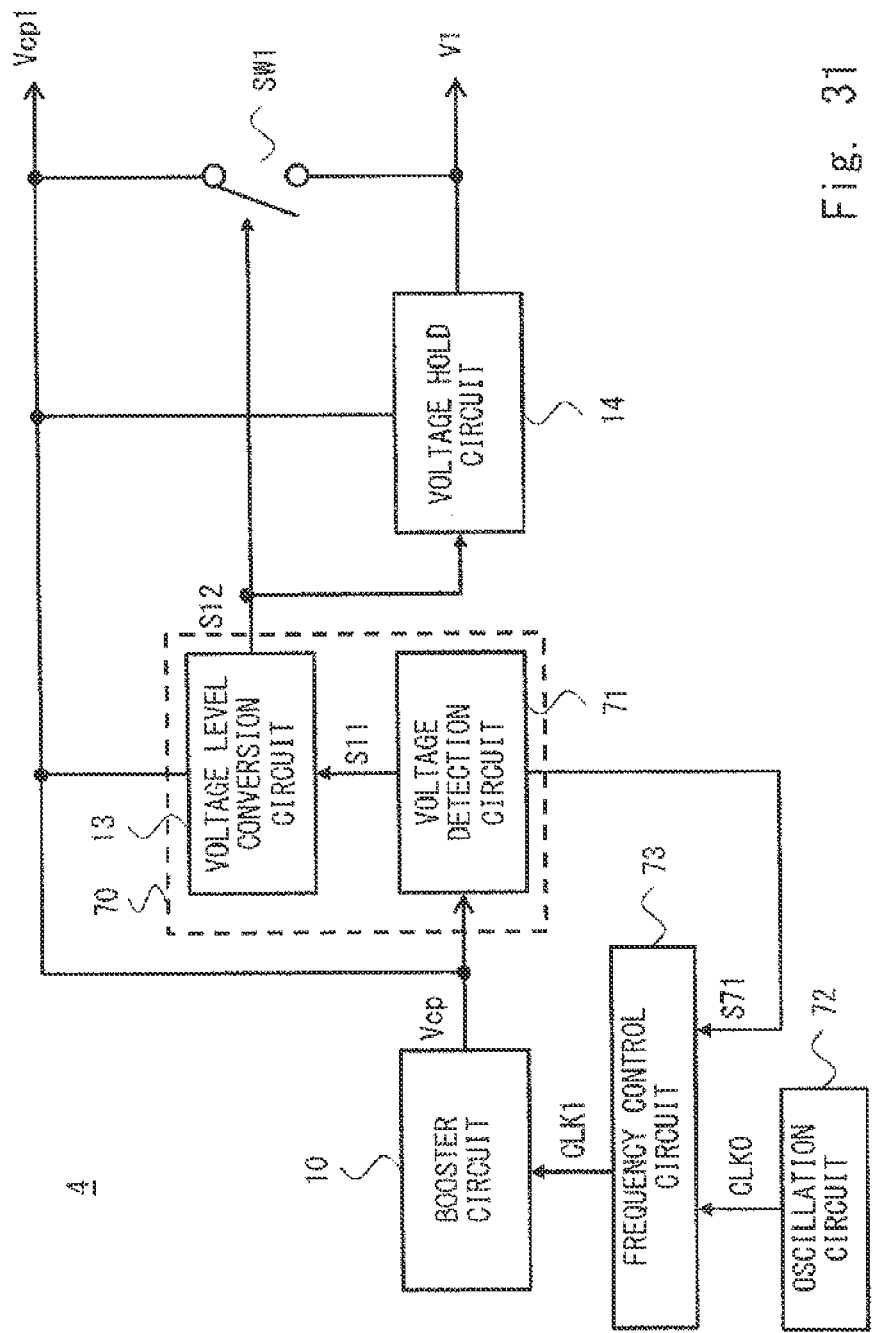
FIG. 31 is a block diagram of a semiconductor device according to an eighth embodiment.

Although the voltage hold circuit 143 that supports the booster circuit 10 is described in the description of the seventh embodiment, a current control circuit that supports the negative booster circuit 30 can be configured by configuring the current control circuit 60 shown in FIG. 31 using NMOS transistors.

Eighth Embodiment

FIG. 31 shows a block diagram of a semiconductor device 4 according to an eighth embodiment. As shown in FIG. 31, the semiconductor device 4 according to the eighth embodiment is another example of the semiconductor device 1 according to the first embodiment. The semiconductor device 4 according to the eighth embodiment has a configuration to reduce the overshoot of the second boosted voltage V1. Note that, in the description of the eighth embodiment, the same elements as those of the first embodiment are denoted by the same reference symbols as in the first embodiment and not repeatedly described.

Figure 32:
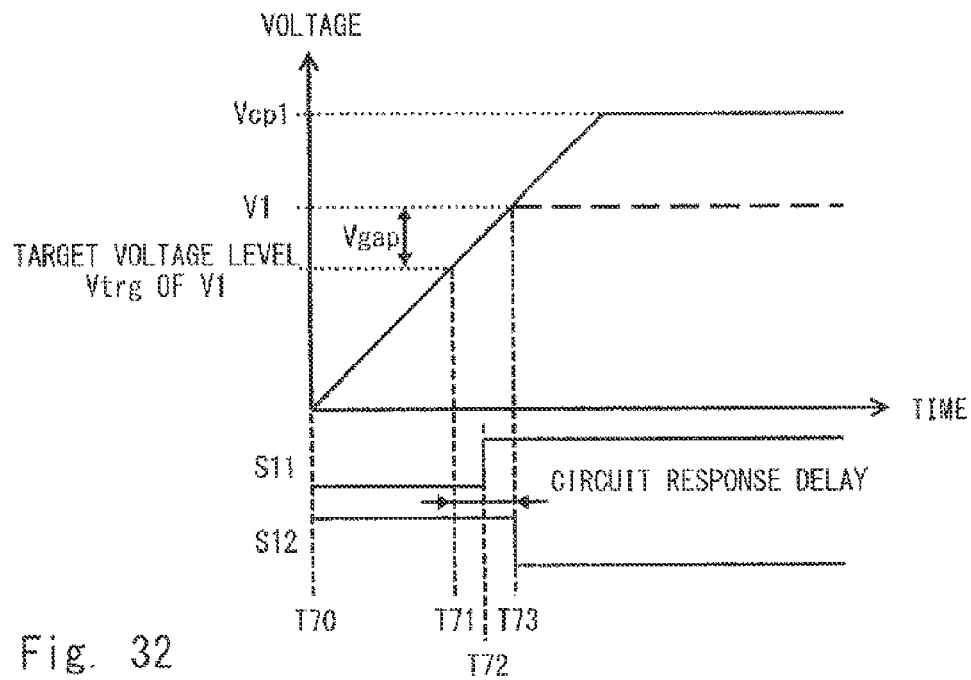
FIG. 32 is a timing chart showing an operation of a semiconductor device to describe a problem of overshoot of a booster circuit.

Firstly, the problem of overshoot of the second boosted voltage V1 is described. FIG. 32 is a timing chart to describe the problem of overshoot of the second boosted voltage. The timing chart shown in FIG. 32 is the case where a significant problem occurs in the semiconductor device 1 according to the first embodiment.

In the timing chart shown in FIG. 32, the booster circuit 10 starts the boost operation at timing T70. Then, at timing T71, the output voltage reaches a target voltage level Vtrg of the second boosted voltage. However, because a circuit response delay occurs in the voltage detection circuit 12, the voltage detection signal S11 becomes enabled at timing T72, which is later than timing T71. Further, because a circuit response delay occurs in the voltage level conversion circuit 13, the switch signal S12 becomes LOW level at timing T73, which is yet later than timing T72. Then, in the example shown in FIG. 32, at timing T73, the voltage hold circuit 14 outputs the second boosted voltage V1 based on the output voltage at that point of time.

In this manner, in the case where a circuit response delay in the voltage detection circuit 12 and the voltage level conversion circuit 13 is large, the problem of overshoot where the voltage of the second boosted voltage V1 becomes larger than the target voltage level Vtrg occurs. The problem of overshoot is more significant as the boost speed of the booster circuit 10 is higher. Note that, in FIG. 32, the gap of voltage caused by the overshoot is indicated by Vgap.

In order to solve the problem of overshoot, the semiconductor device 4 according to the eighth embodiment includes a control circuit 70 in place of the control circuit 11. Further, the semiconductor device 4 according to the eighth embodiment further includes a frequency control circuit 73. Note that, in FIG. 31, an oscillation circuit 72 that supplies an operation clock to the booster circuit 10 is shown.

The control circuit 70 outputs a frequency switch signal S71 that instructs the frequency control circuit 73 to lower the frequency of the operation clock CLK1 during a specified period when the output voltage reaches a frequency switch voltage level Vsw having a smaller absolute value than the hold voltage level. The control circuit 70 includes a voltage detection circuit 71 in place of the voltage detection circuit 12. The voltage detection circuit 71 detects that the output voltage reaches the hold voltage level in the same manner as the voltage detection circuit 12. At this time, the voltage detection circuit 71 enables the frequency switch signal S71 at the same time as the voltage detection signal S11, thereby instructing the frequency control circuit 73 to lower the frequency of the operation clock CLK1. Note that the voltage detection circuit 71 disables the frequency switch signal S71 at the point when a specified period has passed after enabling the frequency switch signal S71.

The frequency control circuit 73 generates the operation clock CLK1 by changing the frequency of an operation clock CLK0 that is output from the oscillation circuit 72 in accordance with the frequency switch signal S71 that is output from the control circuit 70. The booster circuit 10 operates on the basis of the operation clock CLK1.

Figure 33:
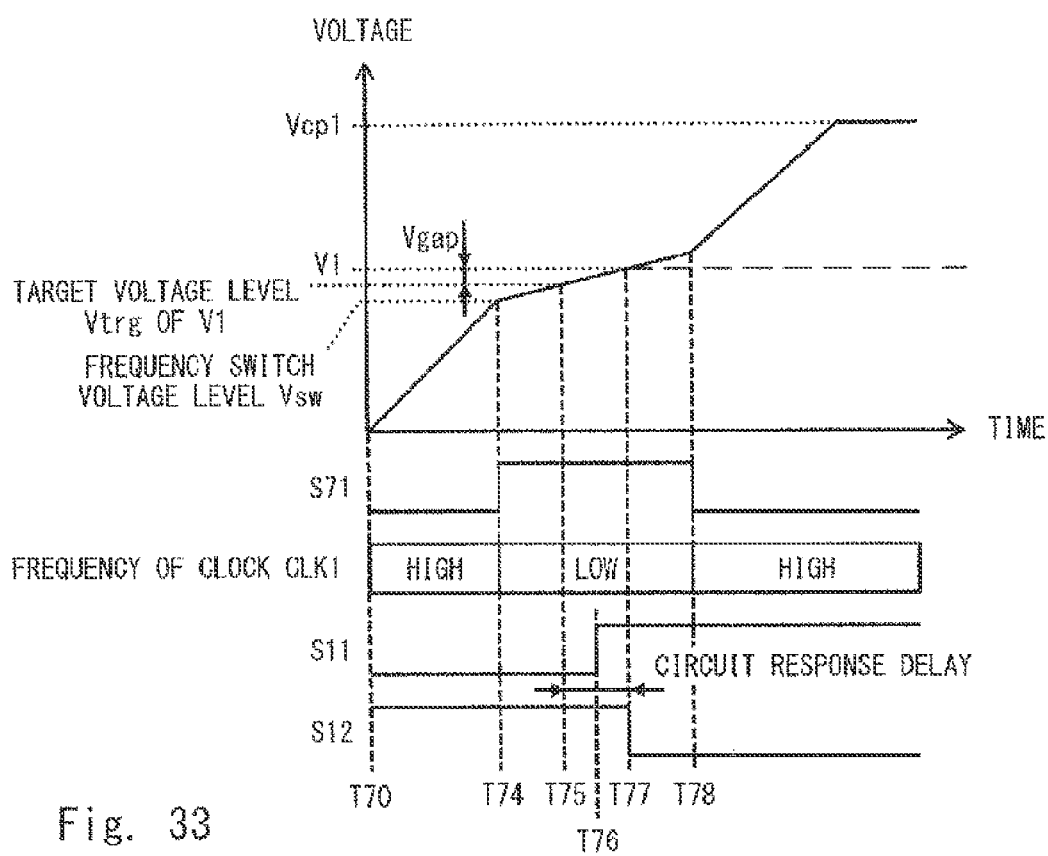
FIG. 33 is a timing chart showing an operation of the semiconductor device according to the eighth embodiment.

An operation of the semiconductor device 4 according to the eighth embodiment is described hereinafter. FIG. 33 is a timing chart showing the operation of the semiconductor device 4 according to the eighth embodiment. In the example shown in FIG. 33, the boost operation of the booster circuit 10 is started at timing T70. Then, at timing T74, the output voltage of the booster circuit 10 reaches the frequency switch voltage level Vsw. The control circuit 70 thereby enables the frequency switch signal S71. Then, in response that the frequency switch signal S71 becomes enabled, the frequency control circuit 73 switches the frequency of the operation clock CLK1 to a lower frequency. As a result that the frequency of the supplied operation clock CLK1 is lowered, the booster circuit 10 reduces the boost speed.

Then, at timing T75, the output voltage of the booster circuit 10 reaches the target voltage level Vtrg of the second boosted voltage V1. In response that the output voltage reaches the target voltage level Vtrg of V1, the voltage detection signal S11 becomes enabled at timing T76 and the switch signal S12 becomes LOW level at timing T77. Accordingly, at timing T77, the voltage hold circuit 14 outputs the second boosted voltage V1 based on the output voltage at that point of time and then maintains this voltage subsequently. After that, at timing T78, a specified period that is preset from timing T74 ends. Thus, at timing T78, the frequency switch signal S71 becomes disabled. Then, in response that the frequency switch signal S71 becomes disabled, the frequency control circuit 73 causes the frequency of the operation clock CLK1 to return to the original frequency. The booster circuit 10 thereby increases the boost speed again.

As described above, in the semiconductor device 4 according to the eighth embodiment, the frequency of the operation clock CLK1 of the booster circuit 10 is lowered at the point of time when the output voltage of the booster circuit 10 reaches the frequency switch voltage level Vsw that is lower than the target voltage level Vtrg. Consequently, in the semiconductor device 4 according to the eighth embodiment, the overshoot amount of the second boosted voltage V1 can be reduced even when a circuit delay occurs in the voltage detection circuit 71 and the voltage level conversion circuit 13.

Ninth Embodiment

In a ninth embodiment also, a semiconductor device having a configuration for preventing the overshoot of the second boosted voltage is described. Specifically, a semiconductor device 5 according to the ninth embodiment is another example of the semiconductor device 4 according to the eighth embodiment. Note that, in the description of the ninth embodiment, the elements described in the previous embodiments are denoted by the same reference symbols as in the previous embodiments and not repeatedly described.

Figure 34:
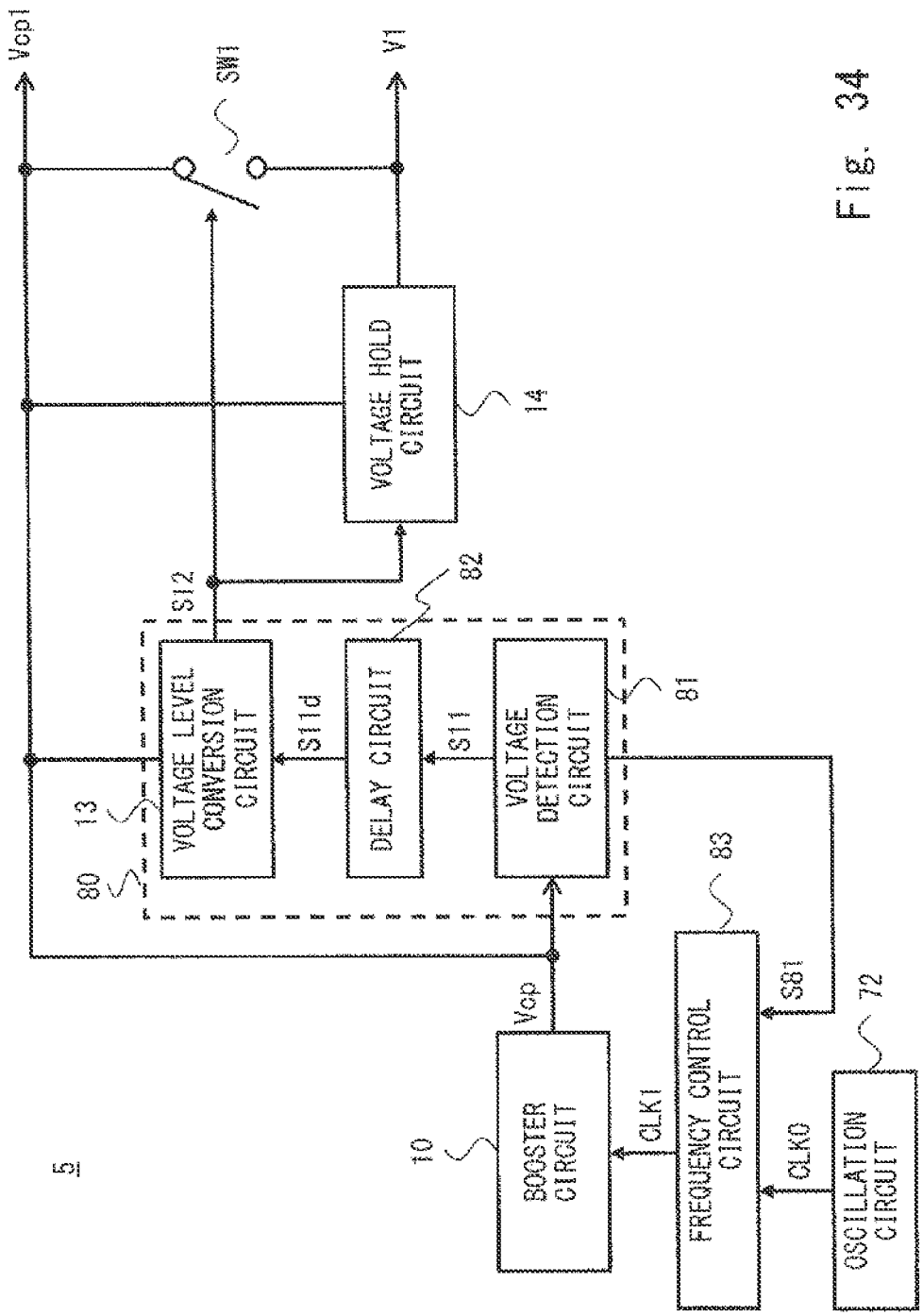
FIG. 34 is a block diagram of a semiconductor device according to a ninth embodiment.

FIG. 34 shows a block diagram of the semiconductor device 5 according to the ninth embodiment. As shown in FIG. 34, the semiconductor device 5 includes a control circuit 80 in place of the control circuit 70 of the semiconductor device 4 according to the eighth embodiment. Further, the semiconductor device 5 includes a frequency control circuit 83 in place of the frequency control circuit 73 of the semiconductor device 4 according to the eighth embodiment. Note that, in FIG. 34 also, an oscillation circuit 72 that supplies an operation clock CLK0 of the booster circuit 10 is shown.

The control circuit 80 includes a voltage detection circuit 81, a delay circuit 82, and a voltage level conversion circuit 13. The voltage detection circuit 81 outputs a clock switch signal S81 that instructs the frequency control circuit 83 to switch between the supply of the operation clock CLK1 and the stop of the operation clock CLK1 at specified intervals during a specified period when the output voltage of the booster circuit 10 reaches the hold voltage level. Further, the voltage detection circuit 81 enables the voltage detection signal S11 in response that the output voltage of the booster circuit 10 reaches the hold voltage level.

The delay circuit 82 outputs a delay voltage detection signal S11d that is delayed behind the voltage detection signal S11 in accordance with the preset delay time. Then, the voltage level conversion circuit 13 switches the logic level of the switch signal S12 in accordance with the delay voltage detection signal S11d.

The frequency control circuit 83 controls the supply condition of the operation clock CLK1 to the booster circuit. To be more specific, the frequency control circuit 83 stops during the period when the clock switch signal S81 is enabled (for example, HIGH level) and outputs the operation clock CLK1 having a clock waveform corresponding to the operation clock CLK0 during the period when the clock switch signal S81 is disabled (for example, LOW level).

Figure 35:
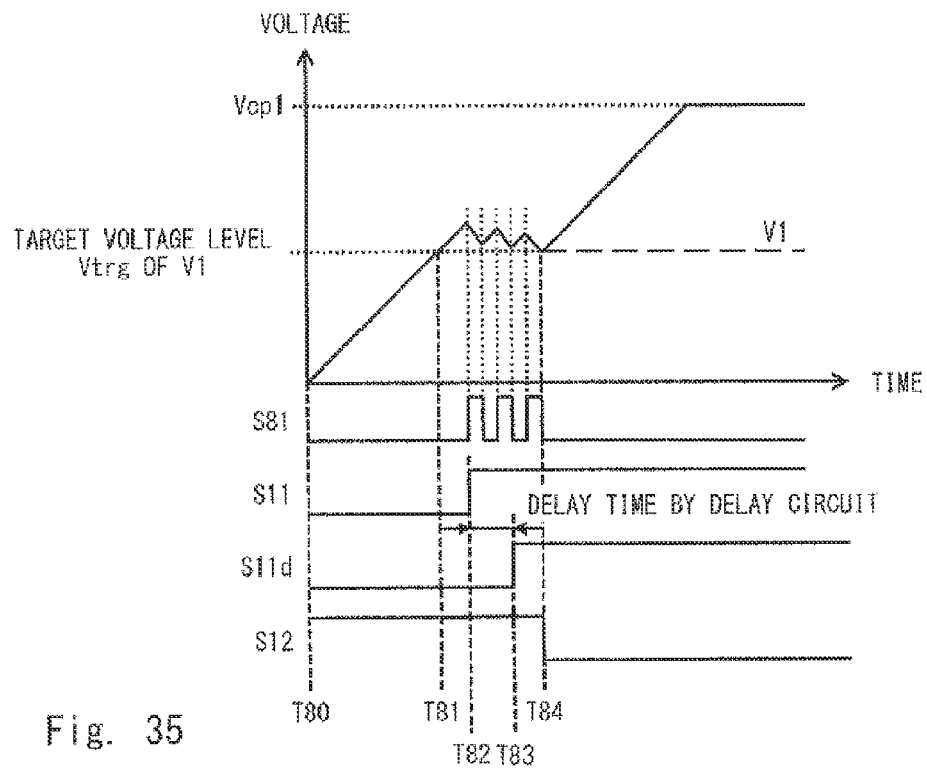
FIG. 35 is a timing chart showing an operation of the semiconductor device according to the ninth embodiment.

An operation of the semiconductor device 5 according to the ninth embodiment is described hereinafter. FIG. 35 is a timing chart showing the operation of the semiconductor device 5 according to the ninth embodiment. In the example shown in FIG. 35, the booster circuit 10 starts the boost operation at timing T80. At the point of timing T80, the clock switch signal S81 is disabled. Then, at timing T81, the output voltage of the booster circuit 10 reaches Vtrg, which is the target voltage level of the second boosted voltage V1.

Then, after a delay time due to the circuit response delay of the voltage detection circuit 81 from timing T81, the voltage detection signal S11 is enabled at timing T82. Further, during a specified period from timing T82, the voltage detection circuit 81 switches the state of the clock switch signal S81 between enabled state and disabled state at specified intervals. Thus, during the period when the clock switch signal S81 is enabled, the supply of the operation clock to the booster circuit 10 stops, and the output voltage of the booster circuit 10 drops. Further, during the period when the clock switch signal S81 is disabled, the operation clock is supplied to the booster circuit 10, and the output voltage of the booster circuit 10 rises. With the switching of the state of the voltage detection circuit 81, the output voltage of the booster circuit 10 gradually drops and becomes closer to the target voltage level Vtrg of the second boosted voltage V1.

Then, at timing T83 when a delay time that is set to the delay circuit 82 has passed from timing T82, the delay voltage detection signal S11d is enabled. Then, at timing T84 when a delay time due to the circuit delay of the voltage level conversion circuit 13 has passed from timing T83, the switch signal S12 becomes LOW level. The voltage level conversion circuit 13 of the semiconductor device 5 thereby maintains the second boosted voltage V1 based on the output voltage at the point of timing T84.

As described above, in the semiconductor device 5 according to the ninth embodiment, after detecting that the output voltage of the booster circuit 10 exceeds the target voltage level Vtrg of the second boosted voltage V1, the operation clock is supplied to the booster circuit 10 in an intermittent manner in order to adjust the voltage value of the output voltage. It is thereby possible in the semiconductor device 5 to reduce the overshoot of the output voltage. Further, in order to make time to intermittently supply the operation clock to the booster circuit 10, a delay time until the switching of the logic level of the voltage detection signal S11 is transmitted to the voltage level conversion circuit 13 is set by the delay circuit 82. It is thereby possible in the semiconductor device 5 to make time to intermittently supply the operation clock during a period longer than the circuit delay of the voltage detection circuit 81 and the voltage level conversion circuit 13 and make time to adjust the output voltage.

Tenth Embodiment

Figure 36:
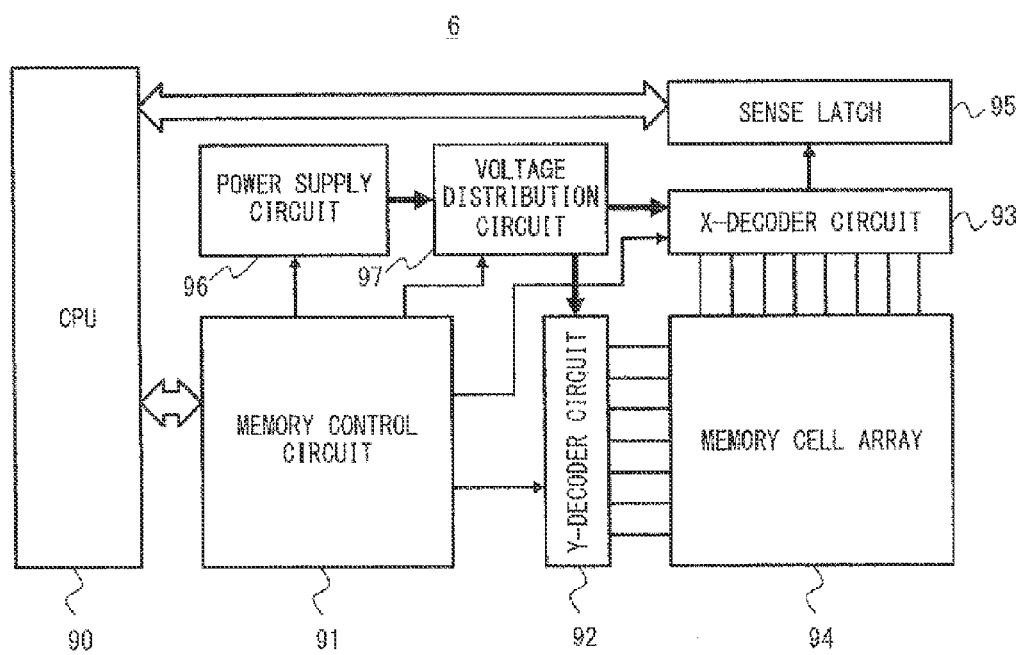
FIG. 36 is a block diagram of a semiconductor device according to a tenth embodiment.

In a tenth embodiment, a semiconductor device 6 that includes a nonvolatile memory cell that uses the boosted voltage described in the above embodiments is described. FIG. 36 shows a block diagram of the semiconductor device 6 according to the tenth embodiment.

As shown in FIG. 34, the semiconductor device 6 according to the tenth embodiment includes a CPU (Central Processing Unit) 90, a memory control circuit 91, a Y-decoder circuit 92, an X-decoder circuit 93, a memory cell array 94, a sense latch 95, a power supply circuit 96, and a voltage distribution circuit 97.

The CPU 90 is an information processing unit of the semiconductor device 6. The memory control circuit 91 makes control such as data write, erase and read to the memory cell array 94 based on an instruction from the CPU 90. The Y-decoder circuit 92 activates a word line in a row where a memory cell to be activated is placed in the memory cell array 94 based on a word line address supplied from the memory control circuit 91. The X-decoder circuit 93 connects a bit line in a column where a memory cell to be activated is placed in the memory cell array 94 to the sense latch 95 based on a bit line address supplied from the memory control circuit 91. In the memory cell array 94, memory cells to store data are arranged in rows and columns. The sense latch 95 reads data from the bit line selected by the X-decoder circuit 93 and outputs the read data to the CPU 90. Note that, when writing data, the sense latch 95 writes data to the selected memory cell by driving the bit line selected by the X-decoder circuit 93.

The power supply circuit 96 is a block in which a circuit corresponding to the semiconductor device described in the above embodiments is placed. Specifically, the power supply circuit 96 includes the booster circuit, the control circuit, the voltage hold circuit, the first switch and the like and at least generates the first boosted voltage and the second boosted voltage. The voltage distribution circuit 97 distributes a plurality of boosted voltages generated in the power supply circuit 96 to the Y-decoder circuit 92 and the X-decoder circuit 93 based on an instruction from the memory control circuit 91. At this time, in the memory cell array, voltages that are different for the respective operations of write, erase and read are supplied to the word line, the bit line, the back gate of the memory cell and the like. Therefore, the voltage distribution circuit 97 distributes the boosted voltage corresponding to the operation to the Y-decoder circuit 92 and the X-decoder circuit 93 based on an instruction from the memory control circuit 91.

In the semiconductor device 6 according to the tenth embodiment, a MONOS (Metal-Oxide-Nitride-Oxide Semiconductor)-type nonvolatile memory is used as one of the memory cells included in the memory cell array 94. The MONOS-type nonvolatile memory cell requires a plurality of power supplies for the respective operations of write, erase and read. Thus, a relationship with the booster circuit configured using the semiconductor device according to the above-described embodiments is described hereinafter, using the write operation of the MONOS-type nonvolatile memory cell as an example of operation.

Further, the MONOS-type nonvolatile memory cell has a plurality of types in its configuration. Thus, as a first example, a relationship between the write operation to a first MONOS-type nonvolatile memory cell whose operating state is controlled by a single word line and the booster circuit according to the above-described embodiments is described. Note that the first MONOS-type nonvolatile memory cell is a memory cell in which an ONO film is formed at the gate of a single transistor.

Figure 37:
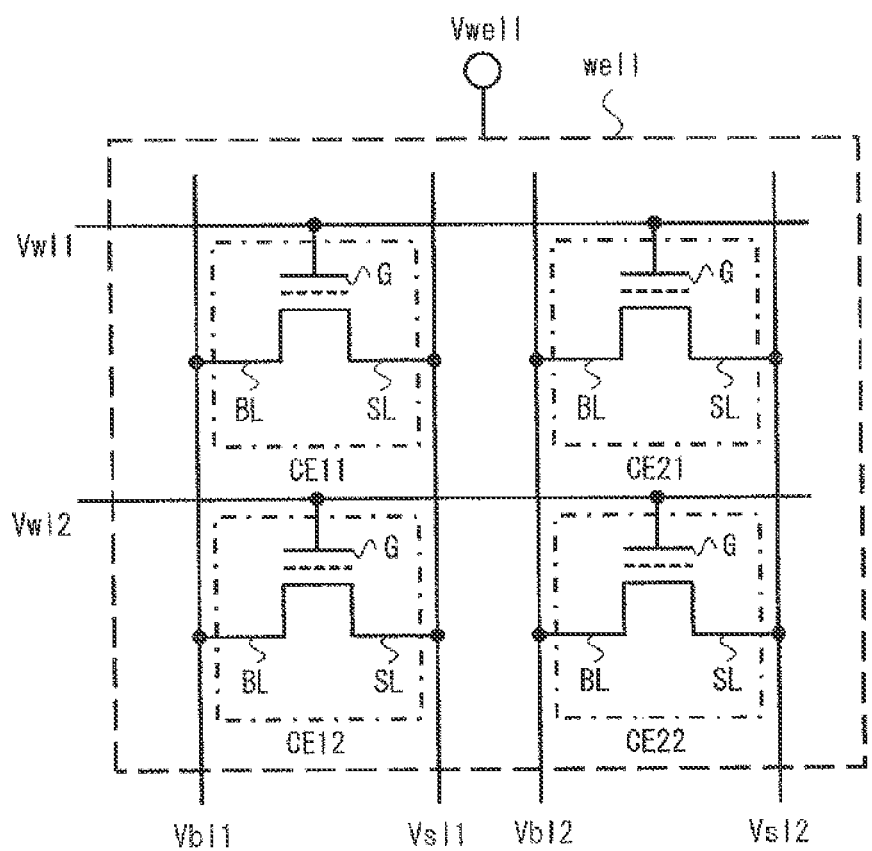
FIG. 37 is a circuit diagram showing a first example of a memory cell array of the semiconductor device according to the tenth embodiment.

FIG. 37 is a circuit diagram showing the first example of the memory cell array of the semiconductor device according to the tenth embodiment. In the circuit diagram of FIG. 37, four memory cells CE11 to CE22 are shown. In the first MONOS-type nonvolatile memory cell, a word line is connected to the gate G, the source SL is connected to one of a bit line pair, and the drain BL is connected to the other one of the bit line pair.

Further, the example of FIG. 37 shows a voltage that is applied during the write operation to the first MONOS-type nonvolatile memory cell. Specifically, a selection voltage Vw11 is supplied to the word line that is connected to the memory cells CE11 and CE21, and a selection voltage Vw12 is supplied to the word line that is connected to the memory cells CE12 and CE22. Further, a voltage Vsl1 is supplied to one of the bit line pair that is connected to the memory cells CE11 and CE12, and a voltage Vbl1 is supplied to the other one of the bit line pair. Further, a voltage Vsl2 is supplied to one of the bit line pair that is connected to the memory cells CE21 and CE22, and a voltage Vbl2 is supplied to the other one of the bit line pair.

FIG. 38 shows a table indicating applied voltages during the write operation to the memory cell CE11. As shown in FIG. 38, when performing the write operation to the memory cell CE11, a voltage of −11.5V is applied to a well region Well of the memory cells CE11 to CE22. Further, a voltage of 1.5V is applied to the gate G of the selected memory cell CE11, and −11.5V is applied to the source SL and the drain BL of the selected memory cell CE11. By applying those voltages to the memory cell CE11, writing of data to the memory cell CE11 is done.

On the other hand, 1.5V is applied also to the gate G of the non-selected memory cell CE21 that is arranged in the same row as the memory cell CE11. Further, −11.5V is applied also to the source SL and the drain BL of the non-selected memory cell CE12 that is arranged in the same column as the memory cell CE11.

In such a case, in order to prevent the disturbance to the non-selected memory cell, it is necessary to apply a voltage slightly higher than the Well voltage (for example, −10.5V) to the word line that is connected to the memory cells CE12 and CE22, and apply a voltage of about −4.5V to the bit line pair that is connected to the memory cells CE21 and CE22. By applying those voltages, it is possible to relax the electric field between the gate and the back gate of the memory cell CE21 and prevent the disturbance. Further, if −11.5V is applied as a non-selection voltage to the gate G of the memory cells CE22, the electric field between the gate and the back gate becomes stronger due to the voltage of −4.5V that is applied to the bit line pair, which can cause the disturbance. Thus, by applying −10.5V, which is smaller than −11.5V, as a non-selection voltage to the gate G of the memory cells CE22, the electric field between the gate and the back gate is relaxed and the disturbance is prevented.

As described above, in the case of using the first MONOS-type nonvolatile memory cell, four voltages are needed in the write operation. Among the four voltages, the power supply voltage that is supplied from the power supply terminal VDD can be used as the voltage of 1.5V. However, it is necessary to use a negative booster circuit for the other three voltages. In this case, by using the negative booster circuit that is configured using the semiconductor device described in the above embodiments, the circuit area can be reduced. To be more specific, −11.5V can be generated by the first boosted voltage Vcp2, −10.5V can be generated by the second boosted voltage V2a, and −4.5V can be generated by the second boosted voltage V2b.

Further, in data rewriting, the speedup of rewrite time, which is high-speed boosted voltage generation, is required. Although the reduction of the circuit area is possible also by the method disclosed in Japanese Unexamined Patent Application Publication No. 2009-301087, it is necessary to increase the driving current of the source follower circuit to achieve high-speed boosted voltage generation, and as a result the area of the booster circuit that uses the source follower circuit as a load increases, and the area reduction effect cannot be obtained sufficiently. On the other hand, in the semiconductor device described in the above embodiments, by using the voltage generation method that involves switching of boost and hold, it is possible to generate a plurality of high voltages at higher speed compared to the method that generates voltages by dropping or dividing the boosted voltage generated already, and the driving current of the source follower circuit can be designed at a minimum necessary value, so that the area reduction effect can be obtained sufficiently.

Next, a write operation in the case of configuring the memory cell array using a second MONOS-type nonvolatile memory cell is described. The second MONOS-type nonvolatile memory cell controls data write, erase and read by two gate voltages.

Figure 39:
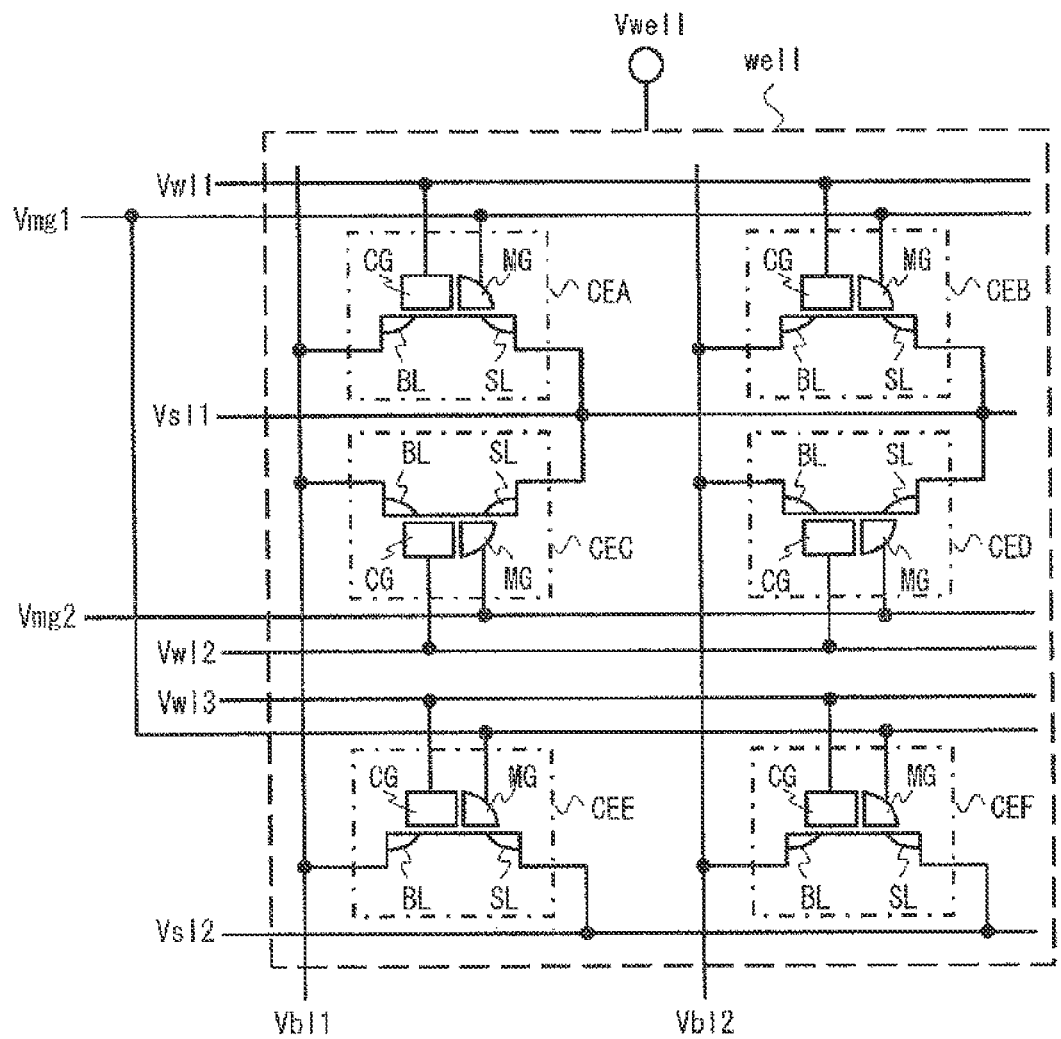
FIG. 39 is a circuit diagram showing a second example of a memory cell array of the semiconductor device according to the tenth embodiment.

FIG. 39 is a circuit diagram showing a second example of the memory cell array of the semiconductor device according to the tenth embodiment. In the circuit diagram of FIG. 39, sixth memory cells CEA to CEF are shown. In the second MONOS-type nonvolatile memory cell, a first word line is connected to the control gate CG, a second word line is connected to the memory gate MG, the source SL is connected to the source voltage supply line, and the drain BL is connected to the bit line.

Further, the example of FIG. 39 shows a voltage that is applied during the write operation to the second MONOS-type nonvolatile memory cell. Specifically, a selection voltage Vw11 is supplied to a first word line that is connected to the memory cells CEA and CEB, a selection voltage Vw12 is supplied to a first word line that is connected to the memory cells CEC and CED, and a selection voltage Vw13 is supplied to a first word line that is connected to the memory cells CEE and CEF. Further, a selection voltage Vmg1 is supplied to a second word line that is connected to the memory cells CEA, CEB, CEE and DEF, and a selection voltage Vmg2 is supplied to a second word line that is connected to the memory cells CEC and CED. Further, a voltage Vsl1 is supplied to a source voltage supply line that is connected to the memory cells CEA to CED, and a voltage Vsl2 is supplied to a source voltage supply line that is connected to the memory cells CEE and CEF. Further, a voltage Vbl1 is supplied to a bit line that is connected to the memory cells CEA, CEC and CEE, and a voltage Vbl2 is supplied to a bit line that is connected to the memory cells CEB, CED and CEF.

FIG. 40 shows a table indicating applied voltages during the write operation to the memory cell CEA. As shown in FIG. 40, when performing the write operation to the memory cell CEA, a voltage of 10.0V is applied to the memory gate MG of the memory cell CEA, 1.0V is applied to the control gate CE of the memory cell CEA, 5.0V is applied to the source SL of the memory cell CEA, and 0.8V is applied to the drain BL of the memory cell CEA. By applying those voltages to the memory cell CEA, writing of data to the memory cell CEA is done.

On the other hand, 10.0V is applied also to the memory gate MG of the non-selected memory cells CEB, CEE and CEF to which the same selection voltage Vmg2 as the memory cell CEA is applied. Further, 1.0V is applied also to the control gate CG of the memory cell CEB that is arranged in the same row as the memory cell CEA. Furthermore, 5.0V is applied also to the source SL of the non-selected memory cells CEB to CED to which the same source voltage supply line as the memory cell CEA is connected. Furthermore, 5.0V is applied also to the drain BL of the non-selected memory cells CEC and CEE that are arranged in the same column as the memory cell CEA.

Thus, in the case of writing to a selected memory cell, an unwanted electric field is generated in non-selected memory cells to which a common line to the selected memory cell is connected, which causes the problem of disturbance in the non-selected memory cells. Thus, in order to relax the unwanted electric field, a voltage of about 3.5V is applied to the memory gate MG of the memory cells CEC and CED, a voltage of about 0.0V is applied to the control gate CG of the memory cells CEC to CEF, a voltage of about 1.5V is applied to the source SL of the memory cells CEE and CEF, and a voltage of about 1.5V is applied to the drain BL of the memory cells CEB, CED and CEF. By applying those voltages to the non-selected memory cells, it is possible to relax the electric field in the non-selected memory cells and prevent the disturbance due to an unwanted high electric field.

As described above, in the case of using the second MONOS-type nonvolatile memory cell, six voltages are needed in the write operation. Among the six voltages, the power supply voltage that is supplied from the power supply terminal VDD and the ground voltage that is supplied from the ground terminal VSS can be used as the voltages of 1.5V, 0.8V and 0.0V. However, it is necessary to use a booster circuit for the other three voltages. In this case, by using the booster circuit that is configured using the semiconductor device described in the above embodiments, the circuit area can be reduced. To be more specific, −10.0V can be generated by the first boosted voltage Vcp1, 3.5V can be generated by the second boosted voltage V2a, and 5.0V can be generated by the second boosted voltage V2b. Further, in the case where high-speed boosted voltage generation is required as well, the area reduction effect can be obtained sufficiently in the semiconductor device described in the above embodiments as described in the case of using the first MONOS-type nonvolatile memory cell.

As described above, in the nonvolatile memory, a plurality of boosted voltages are required for operation. Therefore, by using the booster circuit according to the semiconductor device described in the above embodiments as a circuit that generates the boosted voltages to be supplied to the nonvolatile memory, the area of the semiconductor device as a whole can be reduced. Further, because the booster circuit according to the semiconductor device described in the above embodiments can generate boosted voltages at high speed, it is possible to enhance the speed of writing data to the nonvolatile memory.

The first and tenth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
    a booster circuit that boosts an input voltage and generates a first boosted voltage;
    a voltage hold circuit that holds a second boosted voltage having a smaller absolute value than the first boosted voltage;
    a first output terminal through which the first boosted voltage is output;
    a second output terminal through which the second boosted voltage is output;
    a first switch that is placed between the first output terminal and the second output terminal; and
    a control circuit that generates a switch signal for switching the first switch from close to open in response to an output voltage of the booster circuit reaching a hold voltage level set to the voltage hold circuit,
    wherein the voltage hold circuit increases a voltage value of the second boosted voltage to be output in accordance with the output voltage of the booster circuit during a period when the switch signal indicates close of the first switch, and maintains the voltage value of the second boosted voltage at a point when a value of the switch signal is switched during a period when the switch signal indicates open of the first switch,
    wherein when the switch signal indicates open of the first switch, the voltage value of the second boosted voltage at the point when the value of the switch signal is switched is maintained.

2. The semiconductor device according to claim 1, wherein the voltage hold circuit includes
    a second switch that is controlled to open during a period when the output voltage of the booster circuit is higher than the hold voltage level in accordance with the switch signal, and
    a voltage hold capacitor with one end connected to a boost node at which the output voltage of the booster circuit is generated through the second switch and another end connected to a bias terminal through which a specified voltage is supplied.

3. The semiconductor device according to claim 2, further comprising:
    a buffer circuit that outputs the second boosted voltage based on a voltage of a voltage hold node connecting the second switch and the voltage hold capacitor.

4. The semiconductor device according to claim 3, wherein the buffer circuit is a source follower circuit that outputs the second boosted voltage based on a voltage of the voltage hold node.

5. The semiconductor device according to claim 4, wherein the voltage hold circuit includes
    a second transistor that is a transistor of the same conduction type as a first transistor where a voltage of the voltage hold node is input to a control terminal in the source follower circuit and is diode-connected, and
    the second switch is connected to the boost node through the second transistor.

6. The semiconductor device according to claim 4, wherein the source follower circuit includes
    a first transistor where a voltage of the voltage hold node is input to a control terminal, and
    a current control circuit that generates an operating current of the first transistor, and
    an amount of current to be output from the current control circuit is controlled in accordance with a present value.

7. The semiconductor device according to claim 1, wherein the control circuit includes
    a voltage detection circuit that operates based on a power supply voltage and a ground voltage, detects that the output voltage of the booster circuit exceeds the hold voltage level and outputs a voltage detection signal, and
    a voltage level conversion circuit that converts a maximum value of an amplitude of the voltage detection signal into a voltage in accordance with the output voltage of the booster circuit.

8. The semiconductor device according to claim 1, wherein the voltage hold circuit includes a plurality of voltage hold circuits,
    the first switch includes a plurality of first switches corresponding to the plurality of voltage hold circuits, and
    the control circuit outputs the switch signal to a pair of the first switch and the voltage hold circuit to which the hold voltage level corresponding to a detected voltage value of the output voltage of the booster circuit is set each time the output voltage of the booster circuit reaches a plurality of hold voltage levels respectively set to the plurality of voltage hold circuits.

9. The semiconductor device according to claim 8, wherein the control circuit includes
    a first resistor and a second resistor that are connected in series between a boost node at which the output voltage of the booster circuit is generated and a bias terminal through which a specified voltage is supplied,
    a third resistor that is connected in series with the first resistor and the second resistor and includes a plurality of resistors connected in parallel,
    a comparator that compares a detection target voltage generated at a connection node between the first resistor and the second resistor with a preset reference voltage, and
    a detection voltage control circuit that enables any one of a plurality of switch signals in response that an output of the comparator becomes enabled, and
    the detection voltage control circuit switches a resistor to be short-circuited among the plurality of resistors included in the third resistor at the same time as enabling any one of the plurality of switch signals.

10. The semiconductor device according to claim 1, comprising:
    an oscillation circuit that generates an operation clock of the booster circuit; and
    a frequency control circuit that switches a frequency of the operation clock,
    wherein the control circuit instructs the frequency control circuit to lower a frequency of the operation clock during a specified period in response that the output voltage of the booster circuit reaches a frequency switch voltage level having a smaller absolute value than the hold voltage level.

11. The semiconductor device according to claim 1, comprising:
- an oscillation circuit that generates an operation clock of the booster circuit; and
- a frequency control circuit that controls a supply condition of the operation clock to the booster circuit,
- wherein the control circuit instructs the frequency control circuit to switch between supply of the operation clock and stop of the operation clock at specified intervals during a specified period in response that the output voltage of the booster circuit reaches the hold voltage level.

12. The semiconductor device according to claim 1, comprising:
- a memory cell array that uses at least the first boosted voltage and the second boosted voltage as a control voltage.

13. The semiconductor device according to claim 1, wherein
- the booster circuit is a negative booster circuit that generates a negative boosted voltage lower than a ground voltage.

* * * * *